US012559679B2

(12) United States Patent
Moriya

(10) Patent No.: US 12,559,679 B2
(45) **Date of Patent: *Feb. 24, 2026**

(54) OPTICALLY ANISOTROPIC LAYER, OPTICAL FILM, POLARIZING PLATE, AND IMAGE DISPLAY DEVICE

(71) Applicant: FUJIFILM Corporation, Tokyo (JP)

(72) Inventor: Chie Moriya, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/940,779

(22) Filed: Sep. 8, 2022

(65) Prior Publication Data

US 2023/0037751 A1 Feb. 9, 2023

Related U.S. Application Data

(63) Continuation of application No. PCT/JP2021/012540, filed on Mar. 25, 2021.

(30) Foreign Application Priority Data

Mar. 27, 2020 (JP) ................................ 2020-057462
Jul. 10, 2020 (JP) ................................ 2020-118961
Feb. 10, 2021 (JP) ................................ 2021-020101

(51) Int. Cl.

| | |
|---|---|
| ***G02F 1/1333*** | (2006.01) |
| ***C09K 19/06*** | (2006.01) |
| ***C09K 19/30*** | (2006.01) |
| ***C09K 19/34*** | (2006.01) |
| *G02F 1/1335* | (2006.01) |
| *H10K 59/50* | (2023.01) |
| *H10K 59/80* | (2023.01) |

(52) U.S. Cl.

CPC ........ *C09K 19/3497* (2013.01); *C09K 19/063* (2013.01); *C09K 19/3003* (2013.01); *C09K 19/3068* (2013.01); *C09K 19/3491* (2013.01); *C09K 2019/3004* (2013.01); *C09K 2019/3075* (2013.01); *C09K 2019/3077* (2013.01); *G02F 1/133528* (2013.01); *H10K 59/50* (2023.02); *H10K 59/8791* (2023.02)

(58) Field of Classification Search

CPC .............. C09K 19/3068; C09K 19/063; C09K 19/3804; C09K 19/3003; C09K 19/3491; C09K 2019/3004; C09K 2019/3075; C09K 2019/3077; C09K 2019/0444; C09K 2019/0448; G02F 1/1333; G02F 1/133528

See application file for complete search history.

(56) References Cited

U.S. PATENT DOCUMENTS 10,473,820 B2 * 11/2019 Yamamoto ........... C09D 135/02
11,230,669 B2 * 1/2022 Akutagawa ............... G09F 9/00
2015/0191651 A1 7/2015 Matsuyama et al.
2016/0237351 A1 8/2016 Endou et al.
2017/0003418 A1 1/2017 Yamamoto et al.
2018/0002459 A1 1/2018 Endo et al.
2020/0109333 A1 4/2020 Akutagawa et al.
2020/0140759 A1 5/2020 Shimamura et al.
2022/0213384 A1 * 7/2022 Katoh .................... H05B 33/02
2022/0213385 A1 * 7/2022 Hoshino ................ C09K 19/56
2022/0214484 A1 * 7/2022 Iwasaki ................ G02B 5/3016
2022/0220381 A1 * 7/2022 Nakamura .............. C08F 20/20
2022/0220382 A1 * 7/2022 Inada ................... G02B 5/3025
2022/0228064 A1 * 7/2022 Suzuki ................... H05B 33/02
2022/0267675 A1 * 8/2022 Sumi .................. C09K 19/2007
2023/0037751 A1 * 2/2023 Moriya ..................... G09F 9/30

FOREIGN PATENT DOCUMENTS

JP 2014-198815 A 10/2014
JP 2016-193869 A 11/2016
JP 2017-203168 A 11/2017
WO 2015/056600 A1 4/2015
WO 2015/098702 A1 7/2015
WO 2019/017445 A1 1/2019
WO WO 2019/009255 A1 * 1/2019 ............... G02B 5/30

OTHER PUBLICATIONS

International Search Report issued in PCT/JP2021/012540 on May 25, 2021.
Written Opinion issued in PCT/JP2021/012540 on May 25, 2021.
International Preliminary Report on Patentability completed by WIPO on Sep. 22, 2022 in connection with International Patent Application No. PCT/JP2021/012540.
Office Action issued by the Japanese Patent Office on Oct. 3, 2023, in connection with Japanese Patent Application No. 2022-510664.
Office Action, issued by the State Intellectual Property Office of China on Mar. 28, 2025, in connection with Chinese Patent Application No. 202180022257.5.

* cited by examiner

*Primary Examiner* — Geraldina Visconti
(74) *Attorney, Agent, or Firm* — Edwards Neils LLC; Jean C. Edwards, Esq.

(57) ABSTRACT

Provided is an optically anisotropic layer with which an image display device having suppressed occurrence of oblique light leakage can be manufactured; and an optical film, a polarizing plate, and an image display device, each having the optically anisotropic layer. The optically anisotropic layer is obtained by curing a polymerizable liquid crystal composition including a predetermined rod-like liquid crystal compound and a predetermined monofunctional compound, and immobilizing an alignment state of the rod-like liquid crystal compound, in which a number a1 of atoms of the rod-like liquid crystal compound and a number a2 of atoms of the monofunctional compound satisfy a relationship of Expression (1): $0.2<a2/a1\leq 0.68$, and the rod-like liquid crystal compound is immobilized in a state of being vertically aligned with respect to the main surface of the optically anisotropic layer.

14 Claims, 1 Drawing Sheet

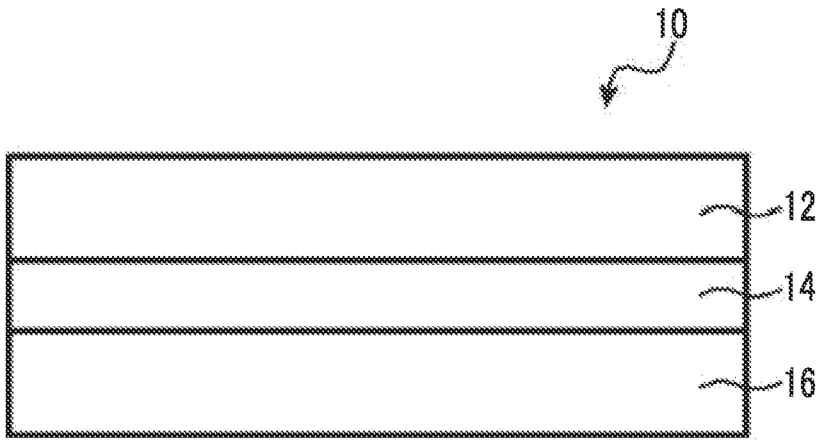
10
12
14
16

OPTICALLY ANISOTROPIC LAYER, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2021/012540 filed on Mar. 25, 2021, which was published under PCT Article 21(2) in Japanese, and which claims priority under 35 U.S.C. § 119(a) to Japanese Patent Application No. 2020-057462 filed on Mar. 27, 2020, Japanese Patent Application No. 2020-118961 filed on Jul. 10, 2020 and Japanese Patent Application No. 2021-020101 filed on Feb. 10, 2021. The above applications are hereby expressly incorporated by reference, in their entirety, into the present application.

BACKGROUND OF THE INVENTION

1. Field of the Invention

The present invention relates to an optically anisotropic layer, an optical film, a polarizing plate, and an image display device.

2. Description of the Related Art

Optical films such as an optical compensation sheet and a phase difference film are used in various image display devices in order to eliminate image coloration or expand a view angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, an optically anisotropic product (optically anisotropic layer) formed by polymerizing a polymerizable composition including a predetermined polymerizable compound having one polymerizable group or two or more polymerizable groups and exhibiting reverse wavelength dispersion, and a predetermined fluorine-based surfactant is described in JP2017-203168A (claims 1 to 4, and the like).

SUMMARY OF THE INVENTION

The present inventors have examined the optically anisotropic layer described in JP2017-203168A and an image display device having the same, and have found that in a case where a polymerizable compound is immobilized in a state of being vertically aligned with respect to the main surface of au optically anisotropic layer, light leakage (hereinafter simply referred to as "oblique light leakage") occurs as a black display of the image display device is viewed from an oblique direction.

Therefore, an object of the present invention is to provide an optically anisotropic layer with which an image display device having suppressed occurrence of oblique light leakage can be manufactured; and an optical film, a polarizing plate, and an image display device, each having the optically anisotropic layer.

The present inventors have conducted intensive studies to accomplish the object, and as a result, they have found that it is possible to suppress occurrence of oblique light leakage in an image display device by using an optically anisotropic layer obtained by curing a polymerizable liquid crystal composition which includes a predetermined rod-like liquid crystal compound and a monofunctional compound, and satisfies a predetermined relational expression regarding the number of atoms thereof, and immobilizing the rod-like liquid crystal compound in a vertically aligned state, thereby completing the present invention.

That is, the present inventors have found that the object can be accomplished by the following configurations.

[1] An optically anisotropic layer obtained by curing a polymerizable liquid crystal composition including a rod-like liquid crystal compound and a monofunctional compound, and immobilizing an alignment state of the rod-like liquid crystal compound, in which the rod-like liquid crystal compound has polymerizable groups $P^1$ and $P^2$ constituting one terminal and the other terminal of the rod-like liquid crystal compound, respectively, and three or more rings $B^1$ selected from the group consisting of an aromatic ring which may have a substituent and an alicyclic ring which may have a substituent, and existing on a bond that links the polymerizable groups $P^1$ and $P^2$, the monofunctional compound has a polymerizable group $P^3$ polymerizable with the rod-like liquid crystal compound, a cyclic organic group $B^2$ which may have a substituent, and one or more rings $B^3$ selected from the group consisting of an aromatic ring which may have a substituent and an alicyclic ring which may have a substituent, and existing on a bond that links the polymerizable group $P^3$ and the cyclic organic group $B^2$, in the monofunctional compound, the polymerizable group $P^3$ constitutes one terminal of the monofunctional compound, and the cyclic organic group $B^2$ constitutes the other terminal of the monofunctional compound, a number a1 of atoms of the rod-like liquid crystal compound and a number a2 of atoms of the monofunctional compound satisfy a relationship of Expression (1), the rod-like liquid crystal compound is immobilized in a state of being vertically aligned with respect to the main surface of the optically anisotropic layer, $$0.2 < a2/a \leq 0.68 \quad \text{Expression (1)}$$

the number a1 of atoms of the rod-like liquid crystal compound represents the number of atoms on a bond that links one terminal and the other terminal of the rod-like liquid crystal compound at the shortest distance, and is construed not to include hydrogen atoms, and the number a2 of atoms of the monofunctional compound represents the number of atoms on a bond that links one terminal and the other terminal of the monofunctional compound at the shortest distance, and is construed not to include hydrogen atoms, where one terminal and the other terminal of a compound mean a starting atom and an ending atom, respectively, for which a maximum number of atoms is calculated in a case where the atoms on a bond of the compound are linked at the shortest distance.

[2] The optically anisotropic layer as described in [1], in which the rod-like liquid crystal compound is a compound exhibiting a liquid crystal state of a smectic phase.

[3] The optically anisotropic layer as described in [1] or [2], in which the rod-like liquid crystal compound has five rings $B^1$.

[4] The optically anisotropic layer as described in any one of [1] to [3], in which the monofunctional compound has one or two rings $B^3$.

[5] The optically anisotropic layer as described in any one of [1] to [4], in which the rod-like liquid crystal compound has any linking group selected from the group consisting of groups represented by Formulae (Ar-1) to (Ar-7) which will be described later.

[6] The optically anisotropic layer as described in [5], in which the rod-like liquid crystal compound is a compound represented by Formula (I) which will be described later.

[7] The optically anisotropic layer as described in [6], in which in Formula (I) which will be described later, all of n1, m1, k1, m2, and n2 are 1.

[8] The optically anisotropic layer as described in [6], in which in Formula (I) which will be described later, both of n1 and n2 are 0, both of m1 and m2 are 2, and k1 is 1.

[9] The optically anisotropic layer as described in any one of [1] to [8], in which the monofunctional compound is a compound represented by Formula (II) which will be described later.

[10] The optically anisotropic layer as described in any one of [1] to [9], in which the rod-like liquid crystal compound has at least one 1,4-cyclohexylene group.

[11] The optically anisotropic layer as described in any one of [1] to [10], in which the monofunctional compound has at least one 1,4-cyclohexylene group or 1,4-phenylene group.

[12] The optically anisotropic layer as described in any one of [1] to [11], in which the optically anisotropic layer is a positive C-plate.

[13] An optical film comprising the optically anisotropic layer as described in any one of [1] to [12].

[14] A polarizing plate comprising:

the optical film as described in [13]; and a polarizer.

[15] An image display device comprising the optical film as described in [13] or the polarizing plate as described in [14].

[16] The image display device as described in [15], in which the image display device is a liquid crystal display device.

[17] The image display device as described in [15], in which the image display device is an organic EL display device.

The present invention provides an optically anisotropic layer with which an image display device having an excellent contrast can be manufactured; and an optical film, a polarizing plate, and an image display device, each having the optically anisotropic layer.

BRIEF DESCRIPTION OF THE DRAWINGS

FIG. 1 is a schematic cross-sectional view showing an example of an optical film.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more kinds of substances are used in combination for each component, the content of the component refers to a total content of the substances used in combination unless otherwise specified.

In addition, in the present specification, the bonding direction of a divalent group (for example, $—CR^3═CR^4—$) as noted is not particularly limited unless the bonding position is specified, and for example, in a case where $X^1$ in Formula (I) which will be described later is —CO—O—, $X^1$ may be either *1—CO—O—O—*2 or *1—O—CO—*2, in which *1 represents a bonding position to the $Sp^1$ side and *2 represents a bonding position to the $Ar^1$ side.

[Optically Anisotropic Layer]

The optically anisotropic layer of an embodiment of the present invention is an optically anisotropic layer formed by curing a polymerizable liquid crystal composition (also simply referred to as "the present composition") including a rod-like liquid crystal compound and a monofunctional compound, and immobilizing the alignment state of the rod-like liquid crystal compound.

In the present invention, the rod-like liquid crystal compound has polymerizable groups $P^1$ and $P^2$ constituting one terminal and the other terminal of the rod-like liquid crystal compound, respectively, and three or more rings $B^1$ selected from the group consisting of an aromatic ring which may have a substituent and an alicyclic ring which may have a substituent, and existing on a bond that links the polymerizable groups $P^1$ and $P^2$.

In addition, in the present invention, the rod-like liquid crystal compound is immobilized in a state of being vertically aligned with respect to the main surface of the optically anisotropic layer.

In addition, in the present invention, the monofunctional compound has a polymerizable group $P^3$ polymerizable with the rod-like liquid crystal compound, a cyclic organic group $B^2$ which may have a substituent, and one or more rings $B^3$ selected from the group consisting of an aromatic ring which may have a substituent and an alicyclic ring which may have a substituent, and existing on a bond that links the polymerizable group $P^3$ and the cyclic organic group $B^2$.

In addition, in the present invention, in the monofunctional compound, the polymerizable group $P^3$ constitutes one terminal of the monofunctional compound, and the cyclic organic group $B^2$ constitutes the other terminal of the monofunctional compound.

Furthermore, in the present invention, the number a1 of atoms of the rod-like liquid crystal compound and the number a2 of atoms of the monofunctional compound satisfy a relationship of Expression (1).

$$0.2<a2/a1\leq 0.68 \qquad \text{Expression (1)}$$

Here, the number a1 of atoms of the rod-like liquid crystal compound represents the number of atoms on a bond that links one terminal and the other terminal of the rod-like liquid crystal compound at the shortest distance, and is construed not to include hydrogen atoms. The number a2 of atoms of the monofunctional compound represents the number of atoms on a bond that links one terminal and the other terminal of the monofunctional compound at the shortest distance, and is construed not to include hydrogen atoms.

In addition, the one terminal and the other terminal of the compound mean a starting atom and an ending atom, respectively, for which a maximum number of atoms is calculated in a case where the atoms on the bond of the compound are linked at the shortest distance.

Incidentally, in a case where the number of atoms on the bond is counted, the atoms which are at the starting point and the ending point are also counted.

Therefore, one and the other of the starting atom and the ending atom in the calculation of the number a1 of atoms of the rod-like liquid crystal compound are included in the polymerizable group $P^1$ and included in the polymerizable group $P^2$.

Similarly, one and the other of the starting atom and the ending atom in the calculation of the number a2 of atoms of the monofunctional compound are included in the polymerizable group $P^3$ and included in the cyclic organic group $B^2$.

For example, since the number a1 of atoms of the following rod-like liquid crystal compound R3 which is an example of the rod-like liquid crystal compound is "50", the number a2 of atoms of the following monofunctional compound A1 which is an example of the monofunctional compound is "22", and "a2/a1" is calculated as 0.44, the rod-like liquid crystal compound R3 and the monofunctional compound A1 satisfy a relationship of Expression (1).

A reason therefor is not specifically clear, but is presumed to be as follows by the present inventors.

That is, it is considered that by satisfying the relationship of Expression (1), the monofunctional compound enters between the molecules of the rod-like liquid crystal compound and the alignment defects generated by curing shrinkage upon immobilization of the alignment state are suppressed without disturbing the alignment state (vertical alignment) of the rod-like liquid crystal compound, and as a result, it is possible to suppress the occurrence of oblique light leakage of an image display device having the optically anisotropic layer.

In the rod-like liquid crystal compound and the monofunctional compound included in the present composition, it is preferable that the number a1 of atoms of the rod-like liquid crystal compound and the number a2 of atoms of the monofunctional compound satisfy a relationship of Expression (1a) for a reason that it is possible to suppress the occurrence of oblique light leakage of an image display device.

$$0.35 < a2/a1 \leq 0.60 \qquad \text{Expression (1a)}$$

[Polymerizable Liquid Crystal Composition]

The present composition includes at least a rod-like liquid crystal compound and a monofunctional compound which satisfy the relationship of Expression (1).

Hereinafter, the respective components of the present composition will be described in detail.

<Rod-Like Liquid Crystal Compound>

The rod-like liquid crystal compound included in the present composition is a compound that has polymerizable groups $P^1$ and $P^2$ constituting one terminal and the other terminal of the rod-like liquid crystal compound, respectively, and three or more rings $B^1$ selected from the group consisting of an aromatic ring which may have a substituent and an alicyclic ring which may have a substituent, and existing on a bond that links the polymerizable groups $P^1$ and $P^2$.

R3

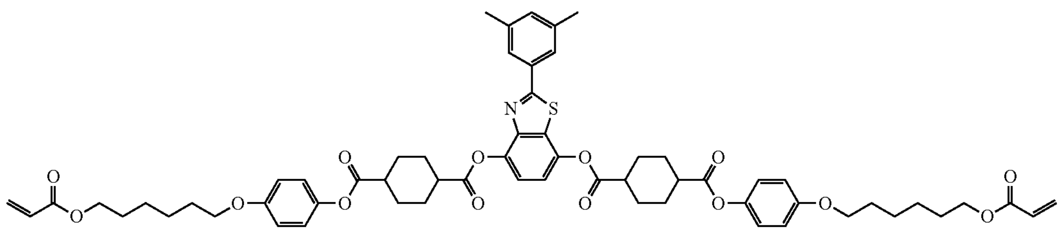

A1

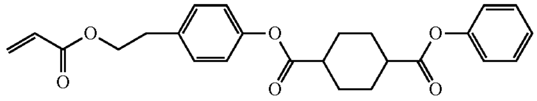

A1

Incidentally, in a case where the present composition includes two or more kinds of rod-like liquid crystal compounds and/or a case where the present composition includes two or more kinds of monofunctional compounds, at least one rod-like liquid crystal compound and at least one monofunctional compound only need to satisfy a relationship of Expression (1).

In the present invention, it is possible to suppress the occurrence of oblique light leakage of an image display device by using an optically anisotropic layer obtained by curing a polymerizable liquid crystal composition having the number a1 of atoms of the rod-like liquid crystal compound and the number a2 of atoms of the monofunctional compound satisfy a relationship of Expression (1), and immobilizing the rod-like liquid crystal compound in a vertically aligned state.

Incidentally, the two polymerizable groups $P^1$ and $P^2$ of the rod-like liquid crystal compound may be the same as or different from each other, and the three or more rings $B^1$ of the rod-like liquid crystal compound may be the same as or different from each other.

In addition, the rod-like liquid crystal compound may have forward wavelength dispersion or reverse wavelength dispersion, and preferably has reverse wavelength dispersion. Since the rod-like liquid crystal compound has the reverse wavelength dispersion, the optical compensability of an optically anisotropic layer can be improved.

In the present specification, the "rod-like liquid crystal compound having reverse wavelength dispersion" means that in a case where an in-plane retardation (Re) value or a thickness-direction retardation (Rth) value at a specific wavelength (visible light range) of a phase difference film manufactured using the compound is measured, the absolute value of the Re value or the Rth value is equal or higher as a measurement wavelength is increased.

In the present specification, the "rod-like liquid crystal compound having forward wavelength dispersion" means that in a case where an in-plane retardation (Re) value or a thickness-direction retardation (Rth) value at a specific wavelength (visible light range) of a phase difference film manufactured using the compound is measured, the absolute value of the Re value or the Rth value is lower as a measurement wavelength is increased.

The polymerizable groups $P^1$ and $P^2$ contained in the rod-like liquid crystal compound are not particularly limited, but are each preferably a polymerizable group which is radically polymerizable or cationically polymerizable.

A known radically polymerizable group can be used as the radically polymerizable group, and suitable examples thereof include an acryloyloxy group or a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetanyl group, or the vinyloxy group is more preferable.

Particularly preferred examples of the polymerizable group include a polymerizable group represented by any of Formulae (P-1) to (P-20).

(P-1)

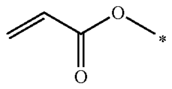

(P-2)

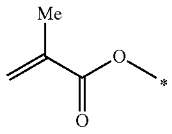

(P-3)

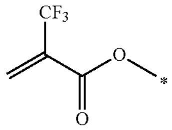

(P-4)

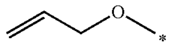

(P-5)

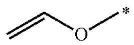

(P-6)

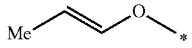

-continued (P-7)

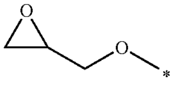

(P-8)

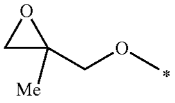

(P-9)

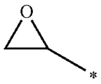

(P-10)

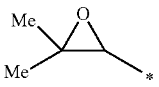

(P-11)

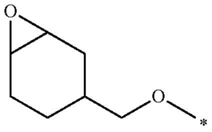

(P-12)

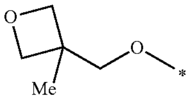

(P-13)

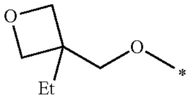

(P-14)

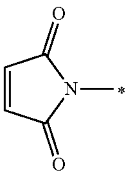

(P-15)

(P-16)

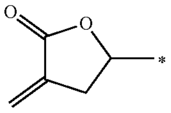

(P-17)

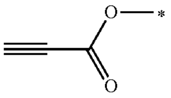

(P-18)

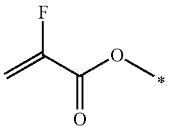

(P-19)

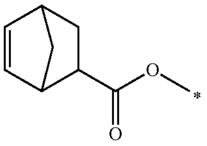

-continued

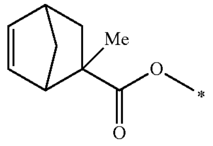

(P-20)

The rod-like liquid crystal compound may have three or more polymerizable groups. In a case where the rod-like liquid crystal compound has three or more polymerizable groups, the polymerizable group other than the above-mentioned polymerizable groups $P^1$ and $P^2$ is not particularly limited, and examples of the polymerizable group, including suitable aspects thereof, include the same ones as the radically polymerizable group or the cationically polymerizable group.

The rod-like liquid crystal compound has three or more rings $B^1$ selected from the group consisting of an aromatic ring which may have a substituent and an alicyclic ring which may have a substituent, and existing on a bond that links the polymerizable groups $P^1$ and $P^2$.

Here, the expression, the ring $B^1$ "existing on a bond that links the polymerizable groups $P^1$ and $P^2$", means that the ring $B^1$ constitutes a part of a portion necessary for directly linking the polymerizable groups $P^1$ and $P^2$.

The rod-like liquid crystal compound may have a portion other than the portion necessary for directly linking the polymerizable groups $P^1$ and $P^2$ (hereinafter also referred to as a "side chain"), but it is construed that the ring structure constituting a part of the side chain is not included in the ring $B^1$.

Examples of the aromatic ring which may have a substituent, which is one aspect of the ring $B^1$, include an aromatic ring having 5 to 20 ring members, which may have a substituent.

Examples of the aromatic ring having 5 to 20 ring members include an aromatic hydrocarbon ring such as a benzene ring, a naphthalene ring, an anthracene ring, and a phenanthrene ring; and an aromatic heterocyclic ring such as a furan ring, a pyrrole ring, a thiophene ring, a pyridine ring, a thiazole ring, and a benzothiazole ring, and among these, the benzene ring (for example, a 1,4-phenyl group) is preferable.

In addition, it is also preferable that the rod-like liquid crystal compound has any of the groups represented by Formulae (Ar-1) to (Ar-7) which will be described later as the ring $B^1$.

Examples of the alicyclic ring which may have a substituent, which is one aspect of the ring $B^1$, include a divalent alicyclic hydrocarbon group having 5 to 20 carbon atoms, which may have a substituent, and a heterocyclic ring in which one or more of —$CH_2$—'s constituting an alicyclic hydrocarbon group having 5 to 20 carbon atoms are substituted with —O—, —S—, or —NH—.

As the divalent alicyclic hydrocarbon group having 5 to 20 carbon atoms, a 5-membered ring or a 6-membered ring is preferable. In addition, the alicyclic hydrocarbon group may be saturated or unsaturated, but is preferably the saturated alicyclic hydrocarbon group. With regard to the divalent alicyclic hydrocarbon group, reference can be made to, for example, the description in paragraph [0078] of JP2012-21068A, the contents of which are hereby incorporated by reference.

As the alicyclic ring which is one aspect of the ring $B^1$, a cycloalkane ring having 5 to 20 carbon atoms is preferable. Examples of the cycloalkane ring having 5 to 20 carbon atoms include a cyclohexane ring, a cyclopeptane ring, a cyclooctane ring, a cyclododecane ring, and a cyclodocosane ring. Among those, the cyclohexane ring is preferable, a 1,4-cyclohexylene group is more preferable, and a trans-1,4-cyclohexylene group is still more preferable.

The rod-like liquid crystal compound preferably has at least one cyclohexane ring, more preferably has at least one 1,4-cyclohexylene group, and still more preferably has at least one trans-1,4-cyclohexylene group, as the ring $B^1$.

Examples of the substituent which may be contained in the aromatic ring or the alicyclic ring which is one aspect of the ring $B^1$ include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-alkylcarbamate group.

Among those, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a see-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and for example, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group, and for example, a methylcarbonyloxy group, an ethylcarbonyloxy group, an n-propylcarbonyloxy group, or an isopropylcarbonyloxy group is preferable, and the methylcarbonyloxy group is more preferable.

Examples of the halogen atom include a fluorine atom, a chlorine atom, a bromine atom, and an iodine atom, and the fluorine atom or the chlorine atom is preferable.

In the rod-like liquid crystal compound, the number of the rings $B^1$ existing on a bond that links the polymerizable groups $P^1$ and $P^2$ is not particularly limited, but from the viewpoint of the alignment stability of the liquid crystal compound, the number of the rings $B^1$ is preferably 3 to 7, more preferably 4 to 6, and still more preferably 5.

The rod-like liquid crystal compound preferably has any of the groups represented by Formulae (Ar-1) to (Ar-7) from the viewpoint that the optical compensability of an optically anisotropic layer is further improved.

(Ar-1)

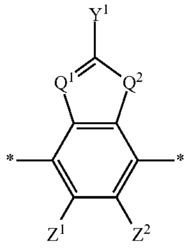

(Ar-2)

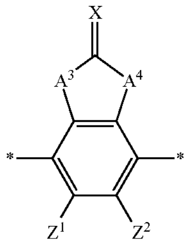

(Ar-3)

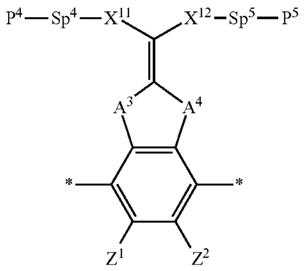

(Ar-4)

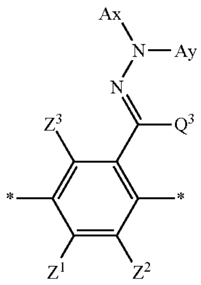

(Ar-5)

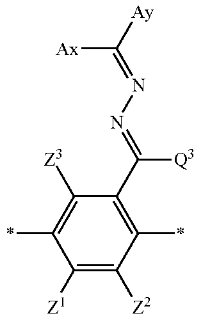

-continued (Ar-6)

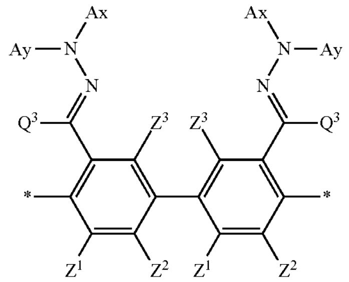

(Ar-7)

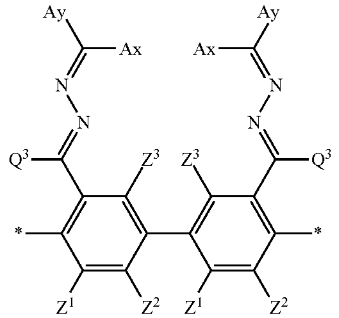

In Formulae (Ar-1) to (Ar-7), * represents a bonding position, that is, a bonding position to a portion other than the aromatic ring included in the rod-like liquid crystal compound.

In addition, in Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$—'s constituting the alicyclic hydrocarbon group may be substituted with —O—, —S—, or —NH—.

Here, examples of the alkyl group having 1 to 6 carbon atoms, represented by $R^6$, include a methyl group, an ethyl group, a propyl group, an isopropyl group, an n-butyl group, an isobutyl group, a sec-butyl group, a tert-butyl group, an n-pentyl group, and an n-hexyl group.

In addition, examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

Examples of the alicyclic hydrocarbon group having 6 to 20 carbon atoms, represented by $Y^1$, include a cyclohexylene group, a cyclopentylene group, a norbornene group, and an adamantylene group.

Examples of the substituent which may be contained in $Y^1$, including suitable aspects thereof, include the same ones as the substituents which may be contained in the aromatic ring or the alicyclic ring which is one aspect of the ring $B^1$.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 3 to 20 carbon atoms, a halogen atom, a cyano group, a nitro group, —$OR^7$, —$NR^8R^9$, —$SR^{10}$, —$COOR^{11}$, or —$COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring.

Here, as the monovalent aliphatic hydrocarbon group having 1 to 20 carbon atoms, an alkyl group having 1 to 15 carbon atoms is preferable, an alkyl group having 1 to 8 carbon atoms is more preferable, a methyl group, an ethyl group, an isopropyl group, a tert-pentyl group (1,1-dimethylpropyl group), a test-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[$5.2.1.0^{2,6}$]decyl group, a tricyclo[$3.3.1.1^{3,7}$]decyl group, a tetracyclo[$6.2.1.1^{3,6}0.0^{2,7}$]dodecyl group, and an adamantyl group.

Examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the monovalent aromatic heterocyclic group having 3 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, examples of the alkyl group having 1 to 6 carbon atoms, represented by each of $R^7$ to $R^{12}$, include a methyl group, an ethyl group, a propyl group, an isopropyl group, an n-butyl group, an isobutyl group, a sec-butyl group, a tert-butyl group, an n-pentyl group, and an n-hexyl group.

In addition, $Z^1$ and $Z^2$ may be bonded to each other to form an aromatic ring, as mentioned above. Examples of the structure in a case where $Z^1$ and $Z^2$ in Formula (Ar-1) are bonded to each other to thin an aromatic ring include a group represented by Formula (Ar-1a). Furthermore, in Formula (Ar-1a), * represents a bonding position, and examples of $Q^1$, $Q^2$, and $Y^1$, including suitable aspects thereof, include the same ones as those described for Formula (Ar-1).

(Ar-1a)

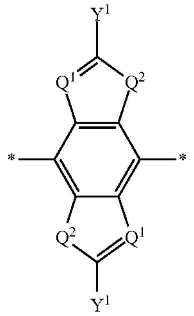

In addition, in Formula (Ar-2), $A^3$ and $A^4$ each independently represent a group selected from the group consisting of —O—, —N($R^{13}$)—, —S—, and —CO—, and $R^{13}$ represents a hydrogen atom or a substituent.

Examples of the substituent represented by $R^{13}$, including suitable aspects thereof, include the same ones as the substituents which may be contained in the aromatic ring or the alicyclic ring which is one aspect of the ring $B^1$.

In addition, in Formula (Ar-2), X represents a hydrogen atom or a non-metal atom of Groups XIV to XVI, to which a substituent may be bonded.

Furthermore, examples of the non-metal atom of Groups XIV to XVI represented by X include an oxygen atom, a sulfur atom, a nitrogen atom to which a hydrogen atom or a substituent is bonded [═N—$R^{N1}$, $R^{N1}$ represents a hydrogen atom or a substituent], and a carbon atom to which a hydrogen atom or a substituent is bonded [═C—$(R^{C1})_2$, $R^{C1}$ represents a hydrogen atom or a substituent].

Examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $X^{11}$ and $X^{12}$ each independently represent a single bond; or —CO—, —O—, —S—, —C(═S)—, —$CR^1R^2$—, —CR═$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms.

Here, examples of the divalent linking group represented by one aspect of $X^{11}$ and $X^{12}$ include —CO—, —O—, —CO—O—, —C(═S)O—, —$CR^1R^2$—, —$CR^1R^2$—$CR^1R^2$—, —O—$CR^1R^2$—, —$CR^1R^2$—O—$CR^1R^2$—, —CO—O—CO—$CR^1R^2$—, —O—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among those, any of —CO—, —O—, and —CO—O— is preferable.

Moreover, in Formula (Ar-3), $Sp^4$ and $Sp^5$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)—, or —CO—, where Q represents a substituent.

Here, examples of the linear or branched alkylene group having 1 to 14 carbon atoms, represented by one aspect of $Sp^4$ and $Sp^5$, include a methylene group, an ethylene group, a propylene group, a butylene group, a pentylene group, a hexylene group, a methylhexylene group, and a heptylene group. Furthermore, as mentioned above, $Sp^4$ and $Sp^5$ may each be a divalent linking group in which one or more of —$CH_2$—'s constituting these alkylene groups are substituted with —O—, —S—, —NH—, —N(Q)—, or —CO—.

Examples of the substituent represented by Q, including suitable aspects thereof, include the same ones as the substituents which may be contained in the aromatic ring or the alicyclic ring which is one aspect of the ring $B^1$.

In addition, in Formula (Ar-3), $P^4$ and $P^5$ each independently represent a monovalent organic group, and at least one of $P^4$ or $P^5$ represents a polymerizable group.

Here, examples of the monovalent organic group represented by each of $P^4$ and $P^5$ include an alkyl group, an aryl group, and a heteroaryl group. The alkyl group may be linear, branched, or cyclic, but is preferably linear. The alkyl group preferably has 1 to 10 carbon atoms. In addition, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group are preferably a nitrogen atom, a sulfur atom, or an oxygen atom. The number of carbon atoms of the heteroaryl group is preferably 6 to 18, and more preferably 6 to 12.

In addition, the alkyl group, the aryl group, and the heteroaryl group may be unsubstituted or have a substituent. Examples of the substituent, including suitable aspects thereof, include the same ones as the substituents which may be contained in the aromatic ring or the alicyclic ring which is one aspect of the ring $B^1$.

In addition, examples of the polymerizable group represented by at least one of $P^4$ or $P^5$ include the same ones as the above-mentioned polymerizable groups which are radically polymerizable or cationically polymerizable, and among these, suitable examples thereof include the polymerizable groups represented by any of Formulae (P-1) to (P-20) mentioned above.

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include the ones described in paragraphs [0039] to [0095] of WO2014/010325A.

In addition, specific examples of the alkyl group having 1 to 6 carbon atoms, represented by $Q^3$, include a methyl group, an ethyl group, a propyl group, an isopropyl group, n-butyl group, an isobutyl group, a sec-butyl group, a tert-butyl group, an n-pentyl group, and an n-hexyl group, and examples of the substituent, including suitable aspects thereof, include the same ones as the substituents which may be contained in the aromatic ring or the alicyclic ring which is one aspect of the ring $B^1$.

The rod-like liquid crystal compound is preferably a compound represented by Formula (I) for a reason that the optical compensability is further improved.

$$P^1\text{-}Sp^1\text{-}(X^1\text{-}Ar^1)_{n1}\text{-}(X^2\text{-}Cy^1)_{m1}\text{-}(X^3\text{-}Ar^3)_{k1}\text{-}X^4\text{-}(Cy^2\text{-}X^5)_{m2}\text{-}(Ar^2\text{-}X^6)_{n2}\text{-}Sp^2\text{-}P^2 \quad (I)$$

In Formula (I), $P^1$ and $P^2$ each independently represent a polymerizable group.

$Sp^1$ and $Sp^2$ each independently represent a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)—, or —CO—, where Q represents a substituent.

n1, m1, m2, and n2 each independently represent an integer of 0 to 2. It should be noted that at least one of m1 or n1 represents 1 or 2, and at least one of m2 or n2 represents 1 or 2.

k1 represents 1 or 2.

$X^1$, $X^2$, $X^3$, $X^4$, $X^5$, and $X^6$ each independently represent a single bond; or —CO—, —O—, —S—, —C(═S)—, —$CR^1R^2$—, $CR^3$═$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n1 is 2, a plurality of $X^1$'s may be the same as or different from each other; in a case where m1 is 2, a plurality of $X^2$'s may be the same as or different from each other; in a case where k1 is 2, a plurality of $X^3$'s may be the same as or different from each other; in a case where m2 is 2, a plurality of $X^5$'s may be the same as or different from each other; and in a case where n2 is 2, a plurality of $X^6$'s may be the same as or different from each other.

$Ar^1$ and $Ar^2$ each independently represent an aromatic ring which may have a substituent. It should be noted that in a case where n1 is 2, a plurality of $Ar^1$'s may be the same as or different from each other; and in a case where n2 is 2, a plurality of $Ar^2$'s may be the same as or different from each other.

$Cy^1$ and $Cy^2$ each independently represent an alicyclic ring which may have a substituent. It should be noted that in a case where m1 is 2, a plurality of $Cy^1$'s may be the same as or different from each other; and in a case where m2 is 2, a plurality of $Cy^2$'s may be the same as or different from each other.

$Ar^3$ represents any of aromatic rings selected from the group consisting of the above-mentioned groups represented by Formulae (Ar-1) to (Ar-7). It should be noted that in a case where k1 is 2, a plurality of $Ar^3$'s may be the same as or different from each other.

In Formula (I), examples of the polymerizable group represented by each of $P^1$ and $P^2$ include the same ones as the above-mentioned polymerizable groups which are radically polymerizable or cationically polymerizable; and among these, the above-mentioned polymerizable groups represented by any of Formulae (P-1) to (P-20) are preferable, and the acryloyloxy group or the methacryloyloxy group is more preferable.

In Formula (I), examples of the linear or branched alkylene group having 1 to 14 carbon atoms, represented by one aspect of $Sp^1$ and $Sp^2$, including suitable aspects thereof, include the same ones as those described for $Sp^4$ and $Sp^5$ in Formula (Ar-3).

As $Sp^1$ and $Sp^2$, a linear or branched alkylene group having 1 to 14 carbon atoms (more preferably having 2 to 10 carbon atoms) or a divalent linking group in which one or more of $—CH_2$–'s constituting the linear or branched alkylene group having 2 to 14 carbon atoms (more preferably having 4 to 12 carbon atoms) are substituted with —O— or —CO— is preferable.

In Formula (I), a sum of n1 and m1 and a sum of m2 and n2 are each preferably an integer of 1 to 3, more preferably 1 or 2, and still more preferably 2.

A sum of n1, m1, m2, and n2 is preferably an integer of 3 to 7, more preferably an integer of 3 to 5, and still more preferably 3 or 4.

In Formula (I), k1 is preferably 1.

In the present invention, from the viewpoint of properties of expressing a phase difference per film thickness, that is, enabling a reduction in the thickness, it is preferable that all of n1, m1, k1, m2, and n2 are 1; and from the viewpoint of improving the durability of the optically anisotropic layer, it is preferable that both of n1 and n2 are 0, both of m1 and m2 are 2, and k1 is 1.

In Formula (I), examples of the divalent linking groups represented by $X^1$, $X^2$, $X^3$, $X^4$, $X^5$, and $X^6$ include the same ones as those described in $X^{11}$ and $X^{12}$ in Formula (Ar-3).

As $X^1$, $X^2$, $X^3$, $X^4$, $X^5$, and $X^6$, the single bond, —CO—, —O—, or —CO—O— is preferable.

In Formula (I), examples of the aromatic ring which may have a substituent, represented by each of $Ar^1$ and $Ar^2$, including suitable aspects thereof, include the same ones as the aromatic ring which may have a substituent, which is one aspect of the ring $B^1$.

In Formula (I), examples of the alicyclic ring which may have a substituent, represented by each of $Cy^1$ and $Cy^2$, including suitable aspects thereof, include the same ones as those of the alicyclic ring, which may have a substituent, which is one aspect of the ring $B^1$.

In Formula (I), as $Ar^3$, any of aromatic rings selected from the group consisting of the groups represented by Formula (Ar-1), Formula (Ar-2), Formula (Ar-4), and Formula (Ar-5) is preferable, and any of aromatic rings selected from the group consisting of the groups represented by Formulae (Ar-1) and (Ar-2) is more preferable.

Examples of the compound represented by Formula (I) include the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055]).

Moreover, suitable examples of the compound represented by Formula (I) include compounds represented by Formulae (1) to (22), and specific examples thereof include the compounds having side chain structures shown in Tables 1 to 3 below as K (side chain structure) in Formulae (1) to (22).

Furthermore, in Tables 1 to 3 below, "*" shown in the side chain structure of K. represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

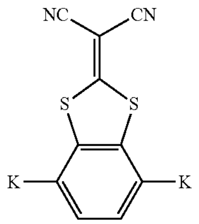

(1)

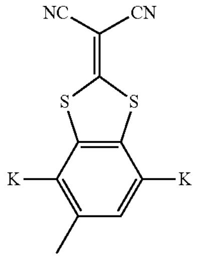

(2)

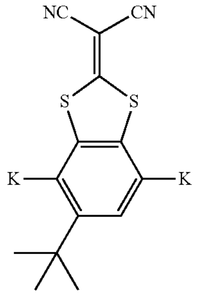

(3)

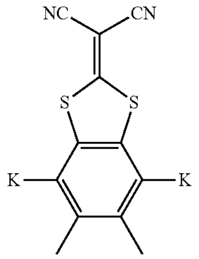

(4)

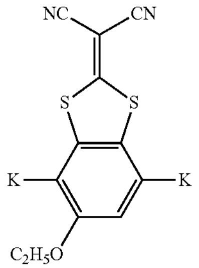

(5)

-continued
(6)
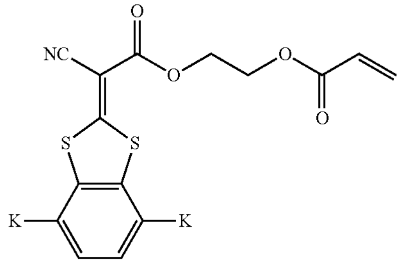
(7)
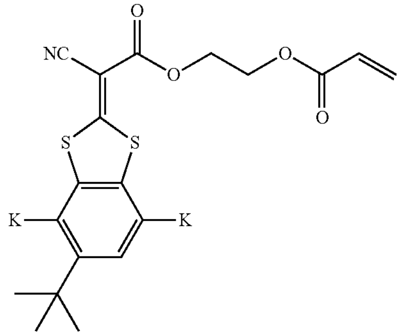
(8)
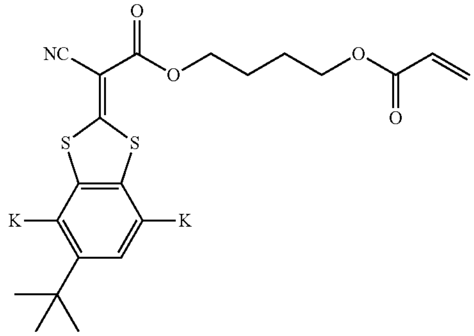
(9)
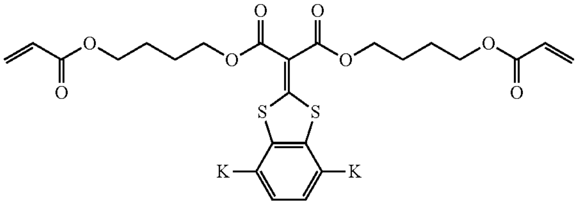
(10)
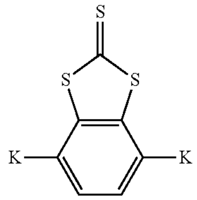
(11)
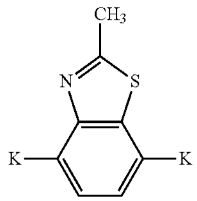
-continued
(12)
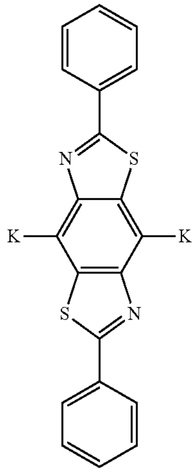
(13)
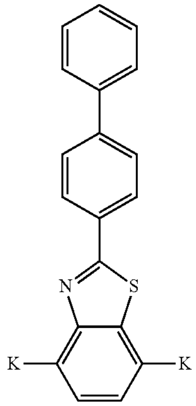
(14)
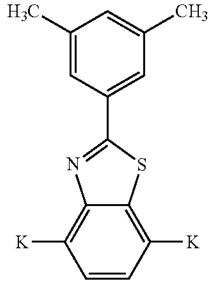
(15)
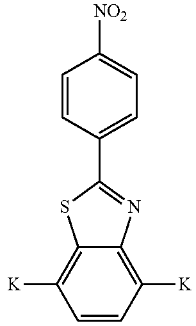

-continued
(16)
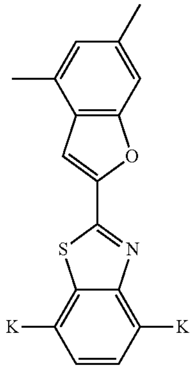
(17)
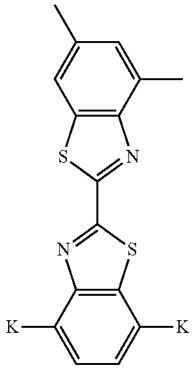
(18)
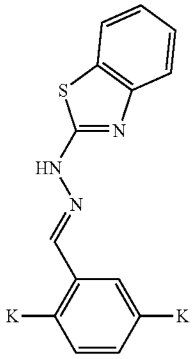
(19)
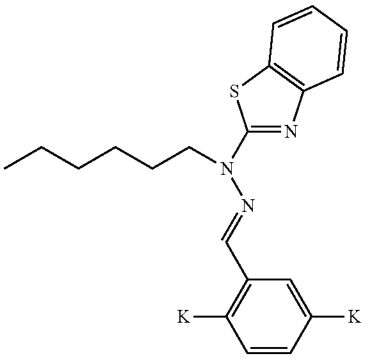
-continued
(20)
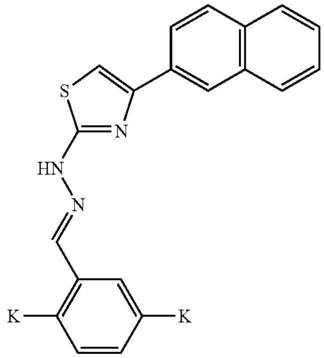
(21)
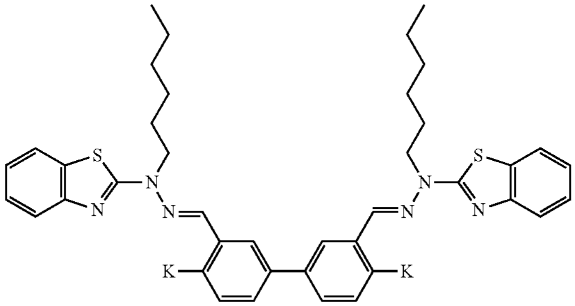
(22)
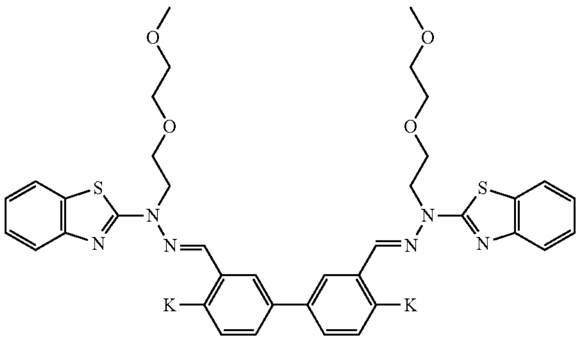

TABLE 1
| | K (side chain structure) |
|---|---|
| 1-1 | 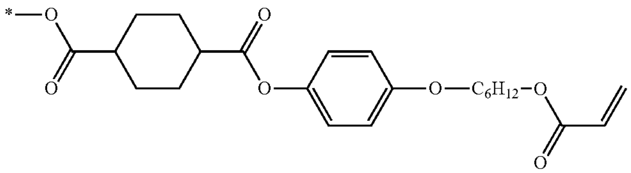 |
| 1-2 | 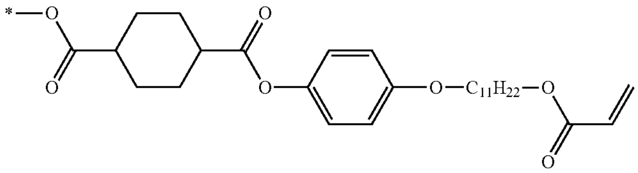 |
| 1-3 | 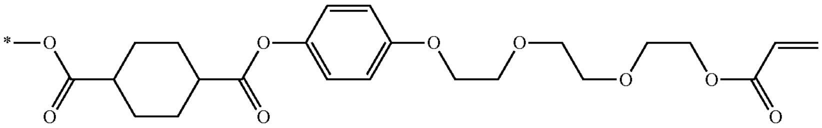 [SMILES: *OC(=O)C1CCC(C(=O)Oc2ccc(OCCOCCOCCOC(=O)C=C)cc2)CC1] |
| 1-4 | 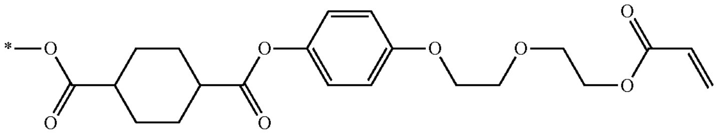 [SMILES: *OC(=O)C1CCC(C(=O)Oc2ccc(OCCOCCOC(=O)C=C)cc2)CC1] |
| 1-5 | 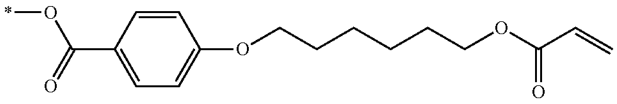 [SMILES: *OC(=O)c1ccc(OCCCCCCOC(=O)C=C)cc1] |
| 1-6 | 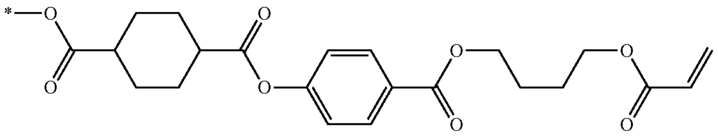 |
TABLE 2
| | K (side chain structure) |
|---|---|
| 2-1 | 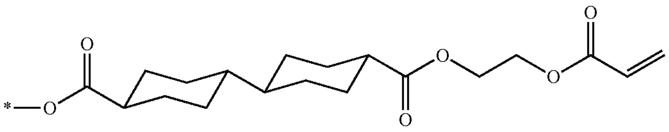 [SMILES: *OC(=O)C1CCC(C2CCC(C(=O)OCCOC(=O)C=C)CC2)CC1] |
| 2-2 | 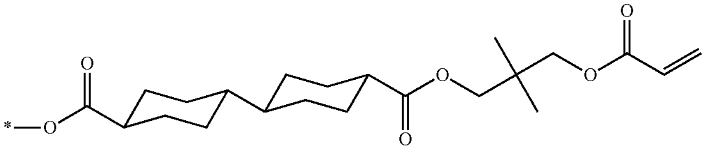 [SMILES: *OC(=O)C1CCC(C2CCC(C(=O)OCC(C)(C)COC(=O)C=C)CC2)CC1] |
| 2-3 | 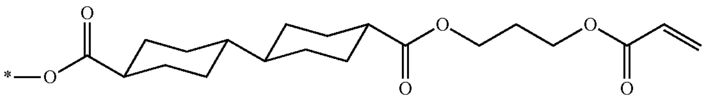 [SMILES: *OC(=O)C1CCC(C2CCC(C(=O)OCCCOC(=O)C=C)CC2)CC1] |

TABLE 2-continued
| K (side chain structure) | |
|---|---|
| 2-4 | 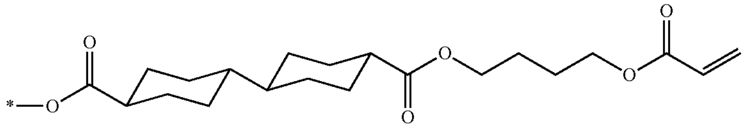 [SMILES: *OC(=O)C1CCC(C2CCC(C(=O)OCCCCOC(=O)C=C)CC2)CC1] |
| 2-5 | 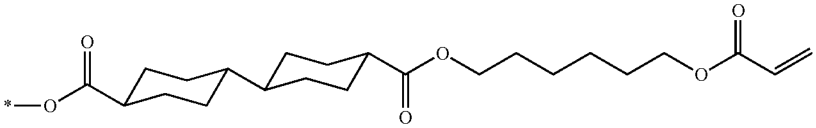 [SMILES: *OC(=O)C1CCC(C2CCC(C(=O)OCCCCCCOC(=O)C=C)CC2)CC1] |
| 2-6 | 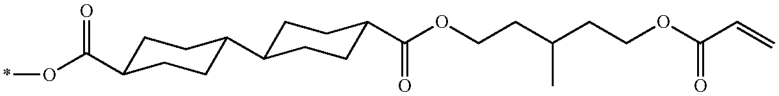 [SMILES: *OC(=O)C1CCC(C2CCC(C(=O)OCCC(C)CCOC(=O)C=C)CC2)CC1] |
| 2-7 | 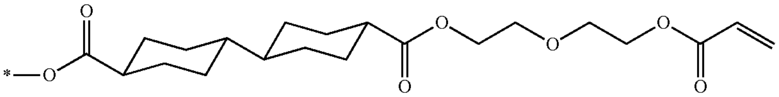 [SMILES: *OC(=O)C1CCC(C2CCC(C(=O)OCCOCCOC(=O)C=C)CC2)CC1] |
| 2-8 | 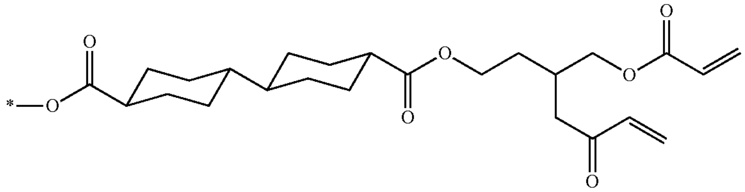 [SMILES: *OC(=O)C1CCC(C2CCC(C(=O)OCCC(COC(=O)C=C)CC(=O)C=C)CC2)CC1] |
| 2-9 | 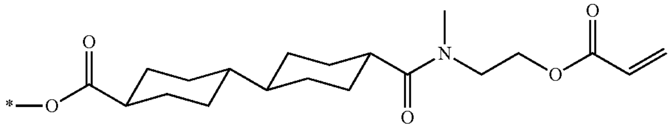 [SMILES: *OC(=O)C1CCC(C2CCC(C(=O)N(C)CCOC(=O)C=C)CC2)CC1] |
| 2-10 | 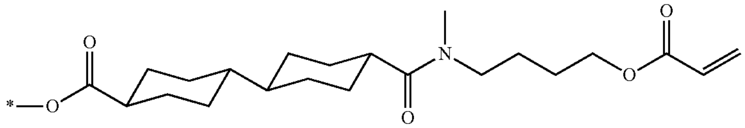 [SMILES: *OC(=O)C1CCC(C2CCC(C(=O)N(C)CCCCOC(=O)C=C)CC2)CC1] |
| 2-11 | 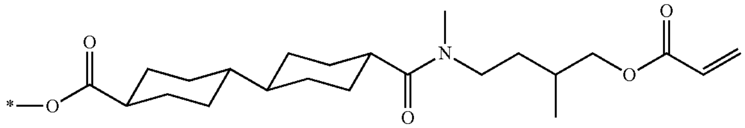 [SMILES: *OC(=O)C1CCC(C2CCC(C(=O)N(C)CCC(C)COC(=O)C=C)CC2)CC1] |
| 2-12 | 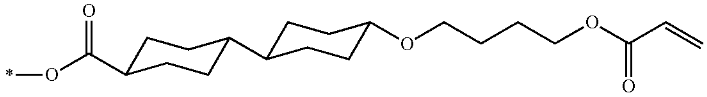 [SMILES: *OC(=O)C1CCC(C2CCC(OCCCCOC(=O)C=C)CC2)CC1] |
| 2-13 | 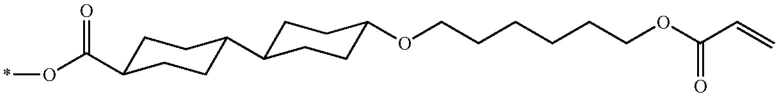 [SMILES: *OC(=O)C1CCC(C2CCC(OCCCCCCOC(=O)C=C)CC2)CC1] |
| 2-14 | 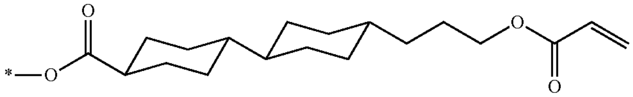 [SMILES: *OC(=O)C1CCC(C2CCC(CCCOC(=O)C=C)CC2)CC1] |

TABLE 3
| | K (side chain structure) |
|---|---|
| 3-1 | 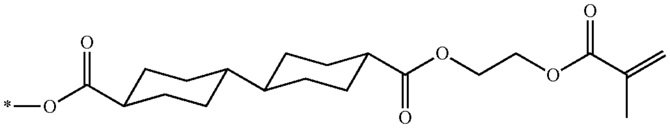 [SMILES: *OC(=O)C1CCC(C2CCC(C(=O)OCCOC(=O)C(=C)C)CC2)CC1] |
| 3-2 | 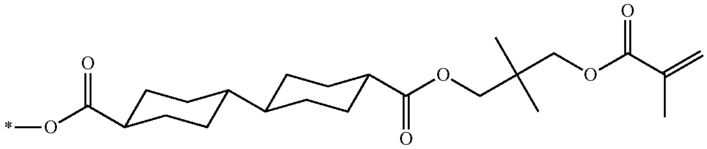 [SMILES: *OC(=O)C1CCC(C2CCC(C(=O)OCC(C)(C)COC(=O)C(=C)C)CC2)CC1] |
| 3-3 | 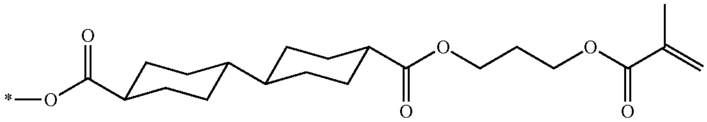 [SMILES: *OC(=O)C1CCC(C2CCC(C(=O)OCCCOC(=O)C(=C)C)CC2)CC1] |
| 3-4 | 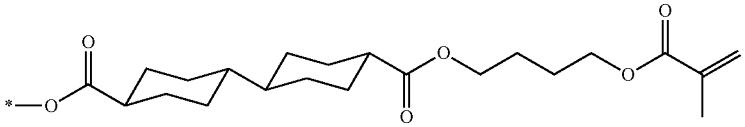 |
| 3-5 | 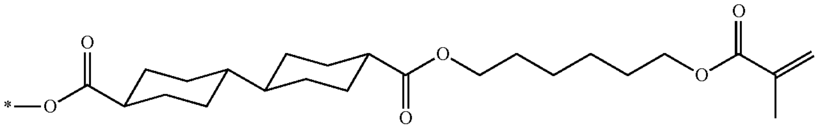 [SMILES: *OC(=O)C1CCC(C2CCC(C(=O)OCCCCCCOC(=O)C(=C)C)CC2)CC1] |
| 3-6 | 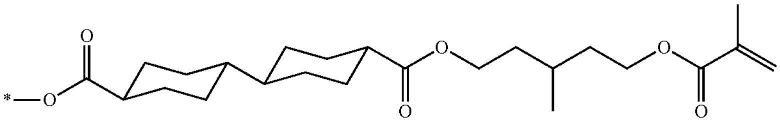 [SMILES: *OC(=O)C1CCC(C2CCC(C(=O)OCCC(C)CCOC(=O)C(=C)C)CC2)CC1] |
| 3-7 | 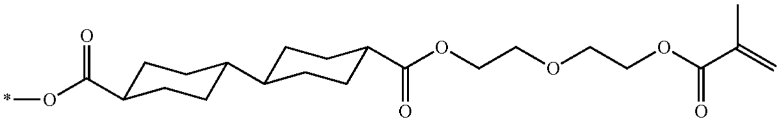 [SMILES: *OC(=O)C1CCC(C2CCC(C(=O)OCCOCCOC(=O)C(=C)C)CC2)CC1] |
| 3-8 | 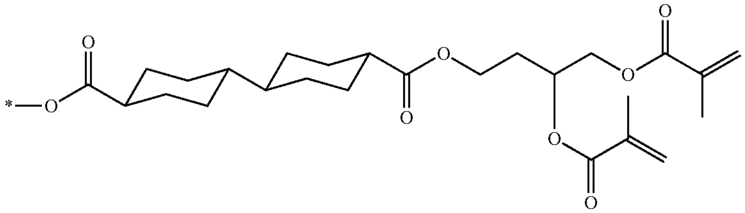 [SMILES: *OC(=O)C1CCC(C2CCC(C(=O)OCCC(COC(=O)C(=C)C)OC(=O)C(=C)C)CC2)CC1] |
| 3-9 | 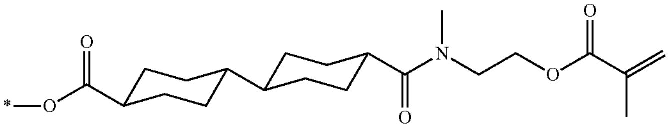 [SMILES: *OC(=O)C1CCC(C2CCC(C(=O)N(C)CCOC(=O)C(=C)C)CC2)CC1] |
| 3-10 | 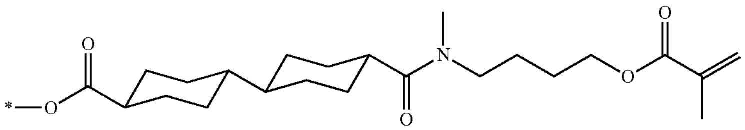 |

TABLE 3-continued

| | K (side chain structure) |
|---|---|
| 3-11 | 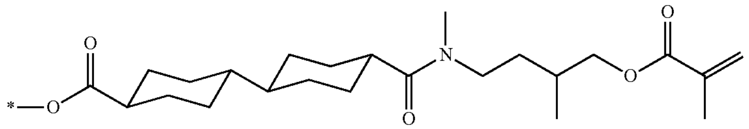 [SMILES: *OC(=O)C1CCC(C2CCC(C(=O)N(C)CCC(C)COC(=O)C(=C)C)CC2)CC1] |
| 3-12 | 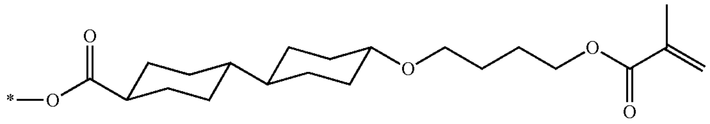 |
| 3-13 | 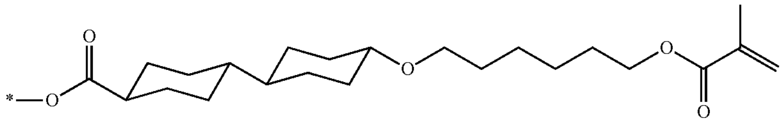 [SMILES: *OC(=O)C1CCC(C2CCC(OCCCCCCOC(=O)C(=C)C)CC2)CC1] |
| 3-14 | 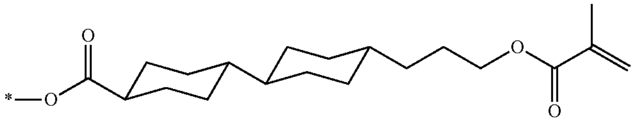 [SMILES: *OC(=O)C1CCC(C2CCC(CCCOC(=O)C(=C)C)CC2)CC1] |

In the present invention, it is preferable that the rod-like liquid crystal compound is a compound exhibiting a liquid crystal state of a smectic phase for a reason that the contrast of an image display device having the optically anisotropic layer is improved.

Among those, the liquid crystal state of the smectic phase exhibited by the rod-like liquid crystal compound is preferably a higher-order smectic phase. Examples of the higher-order smectic phase as mentioned herein include a smectic A phase, a smectic B phase, a smectic D phase, a smectic E phase, a smectic F phase, a smectic G phase, a smectic H phase, a smectic I phase, a smectic J phase, a smectic K phase, and a smectic L phase, and among these, the smectic A phase, the smectic B phase, the smectic F phase, the smectic I phase, the slanted smectic F phase, and the slanted smectic I phase are preferable, and the smectic A phase and the smectic B phase are more preferable.

<Monofunctional Compound>

The monofunctional compound included in the present composition is a compound that has a polymerizable group $P^3$ polymerizable with the rod-like liquid crystal compound, a cyclic organic group $B^2$ which may have a substituent, and one or more rings $B^3$ selected from the group consisting of an aromatic ring which may have a substituent and an alicyclic ring which may have a substituent, and existing on a bond that links the polymerizable group $P^3$ and the cyclic organic group $B^2$.

In addition, the monofunctional compound included in the present composition is the compound in which the polymerizable group $P^3$ constitutes one terminal of the monofunctional compound, and the cyclic organic group $B^2$ constitutes the other terminal of the monofunctional compound.

Here, the expression, "the cyclic organic group $B^2$ constitutes the other terminal of the monofunctional compound", is intended to mean that the cyclic organic group $B^2$ in the cyclic organic group $B^2$ which may have a substituent, that is, the ring structure constitutes the other terminal of the monofunctional compound, and even in a case where the cyclic organic group $B^2$ has a substituent, this substituent does not constitute the other terminal of the monofunctional compound.

Examples of the polymerizable group $P^3$ constituting one terminal of the monofunctional compound, including suitable aspects thereof, include the same ones as the polymerizable groups $P^1$ and $P^2$ of the above-mentioned rod-like liquid crystal compound, and among these, the polymerizable group represented by any of Formulae (P-1) to (P-20) mentioned above is preferable.

Examples of the cyclic organic group $B^2$ constituting the other terminal of the monofunctional compound include an aromatic ring and an alicyclic ring.

Examples of the aromatic ring include aromatic rings having 6 to 20 carbon atoms, and more specifically aromatic hydrocarbon rings such as a benzene ring, a naphthalene ring, an anthracene ring, and a phenanthroline ring; and aromatic heterocyclic rings such as a furan ring, a thiophene ring, a pyrrole ring, an oxazole ring, an isoxazole ring, an oxadiazole ring, a thiazole ring, an isothiazole ring, a thiadiazole ring, an imidazole ring, a pyrazole ring, a triazole ring, a furazan ring, a tetrazole ring, a pyridine ring, a pyridazine ring, a pyrimidine ring, a pyrazine ring, a triazine ring, a tetrazine ring, and a benzothiazole ring; and among these, the benzene ring (for example, a 1,4-phenyl group) is preferable.

In addition, examples of the alicyclic ring include a cycloalkane ring having 5 to 20 carbon atoms, and more specifically include a cyclohexane ring, a cyclopeptane ring, a cyclooctane ring, a cyclododecane ring, and a cyclododecosane ring, and among these, the cyclohexane ring is preferable, a 1,4-cyclohexylene group is more preferable, and a trans-1,4-cyclohexylene group is still more preferable.

Furthermore, examples of the substituent which may be contained in the cyclic organic group $B^2$, including suitable aspects thereof, include the same ones as the substituents which may be contained in the aromatic ring or the alicyclic ring which is one aspect of the ring $B^1$, described in the rod-like liquid crystal compound mentioned above.

It is more preferable that the cyclic organic group $B^2$ constituting the other terminal of the monofunctional compound has no substituent.

In the monofunctional compound, the expression, the ring $B^3$ "existing on a bond that links the polymerizable group $P^3$ and the cyclic organic group $B^2$", means that the ring $B^3$ constitutes a part of a portion necessary for directly linking the polymerizable group $P^3$ and the cyclic organic group $B^2$.

Examples of the aromatic ring which may have a substituent and the alicyclic ring which may have a substituent, represented by the ring $B^3$, including suitable aspects thereof, include the aromatic ring which may have a substituent and the alicyclic ring which may have a substituent, represented by the ring $B^1$, described in the rod-like liquid crystal compound mentioned above.

The monofunctional compound preferably has at least one cyclohexane ring, more preferably has at least one 1,4-cyclohexylene group, and still more preferably has at least one trans-1,4-cyclohexylene group, as the ring $B^3$.

The number of the rings $B^3$ contained in the monofunctional compound is not particularly limited, hut is preferably 1 to 3, and more preferably 1 or 2 from the viewpoint of the alignment properties of the liquid crystal compound.

The monofunctional compound is preferably a compound represented by Formula (II) from the viewpoint of the alignment properties of the liquid crystal compound.

$$P^3\text{-}Sp^3\text{-}(X^7\text{-}B^3)_{n3}\text{-}X^8\text{-}B^2 \quad \text{(II)}$$

In Formula (II), $P^3$ represents a polymerizable group polymerizable with the rod-like liquid crystal compound.

$Sp^3$ represents a single bond, a linear or branched alkylene group having 1 to 14 carbon atoms, or a divalent linking group in which one or more of —$CH_2$—'s constituting the linear or branched alkylene group having 1 to 14 carbon atoms are substituted with —O—, —S—, —NH—, —N(Q)—, or —CO—, where Q represents a substituent.

n3 represents 1 or 2.

$X^7$ and $X^8$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms. It should be noted that in a case where n3 is 2, a plurality of $X^7$'s may be the same as or different from each other.

$B^3$ represents an aromatic ring which may have a substituent or an alicyclic ring which may have a substituent. It should be noted that in a case where n3 is 2, a plurality of $B^3$'s may be the same as or different from each other.

$B^2$ represents a cyclic organic group which may have a substituent.

Furthermore, examples of $B^3$ and $B^2$ include the same ones as described above.

In Formula (II), examples of the polymerizable group represented by $P^3$ include the same ones as the above-mentioned polymerizable groups which are radically polymerizable or cationically polymerizable, described in the rod-like liquid crystal compound mentioned above; among these, the above-mentioned polymerizable groups represented by any of Formulae (P-1) to (P-20) are preferable, and the acryloyloxy group or the methacryloyloxy group is more preferable.

In Formula (II), examples of the linear or branched alkylene group having 1 to 14 carbon atoms, represented by one aspect of $Sp^3$, including suitable aspects thereof, include the same ones as those of the linear or branched alkylene group having 1 to 14 carbon atoms, represented by one aspect of $Sp^1$ and the like in Formula (I).

As $Sp^3$, a linear or branched alkylene group having 1 to 14 carbon atoms or a divalent linking group in which one or more of —$CH_2$—'s constituting the linear or branched alkylene group having 1 to 14 carbon atoms are substituted with —O— or —CO— is preferable, and a linear or branched alkylene group having 1 to 10 carbon atoms is more preferable.

In Formula (II), n3 is preferably 2.

In Formula (II), examples of the divalent linking group represented by each of $X^7$ and $X^8$ include the same ones as those described for $X^{11}$ and $X^{12}$ in Formula (Ar-3).

As $X^7$ and $X^8$, the single bond, —CO—, —O—, or —COO— is preferable.

Specific examples of the compound represented by Formula (II) include compounds represented by Formulae (TN-1) to (TN-14).

(TN-1)

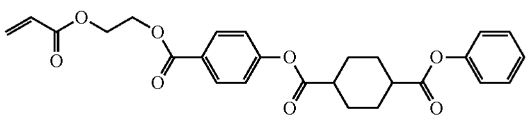

(TN-2)

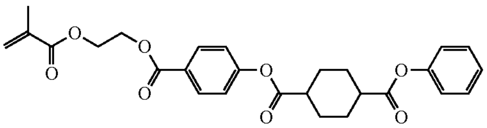

(TN-3)

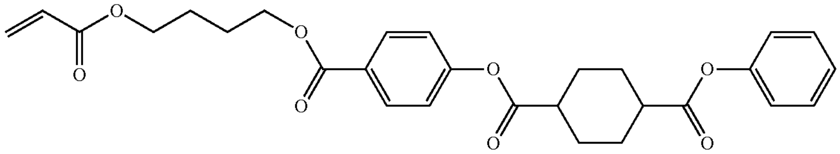

(TN-4)

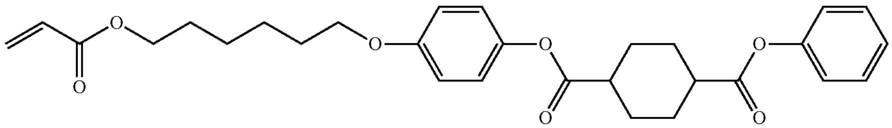

-continued (TN-5)

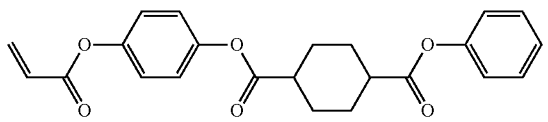

(TN-6)

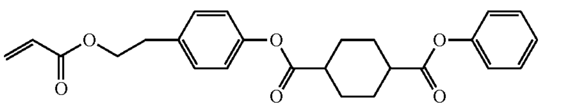

(TN-7)

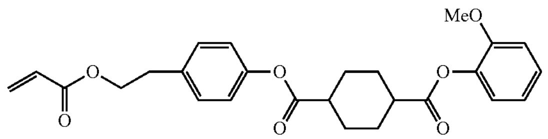

(TN-8)

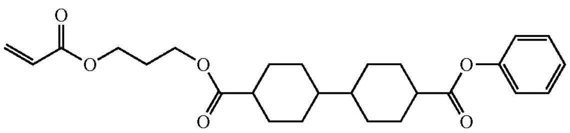

(TN-9)

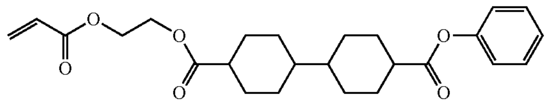

(TN-10)

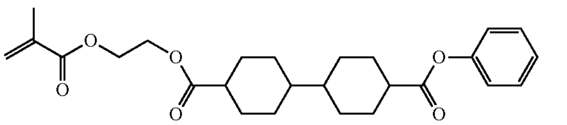

(TN-11)

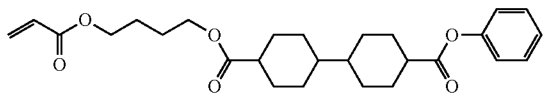

(TN-12)

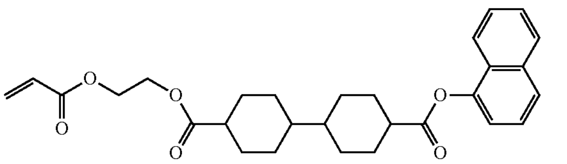

(TN-13)

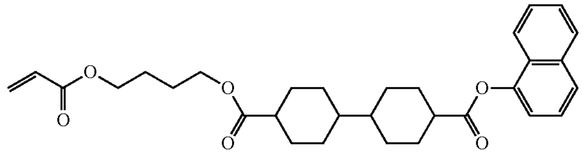

(TN-14)

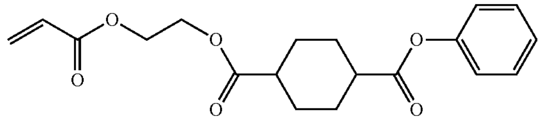

From the viewpoint of suppressing alignment defects due to shrinkage during curing without disturbing the alignment of the liquid crystal compound, a content of the monofunctional compound is preferably 1 to 100 parts by mass, and more preferably 5 to 50 parts by mass with respect to 100 parts by mass of the rod-like liquid crystal compound.

<Polymerization Initiator>

The present composition preferably includes a polymerization initiator.

As the polymerization initiator, a photopolymerization initiator capable of initiating a polymerization reaction upon irradiation with ultraviolet rays is preferable.

Examples of the photopolymerization initiator include α-carbonyl compounds (described in each of U.S. Pat. Nos. 2,367,661A and 2,367,670A), acyloin ethers (described in U.S. Pat. No. 2,448,828A), α-hydrocarbon-substituted aromatic acyloin compounds (described in U.S. Pat. No. 2,722,512A), multinuclear quinone compounds (described in each of U.S. Pat. Nos. 3,046,127A and 2,951,758A), combinations of a triarylimidazole dimer and a p-aminophenyl ketone (described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acyl phosphine oxide compounds (described in JP1988-40799B (JP-S63-40799B), JP1993-29234B (JP-H05-29234B), JP1998-95788A (JP-H10-95788A), and JP1998-29997A (JP-H10-29997A)).

As the polymerization initiator, an oxime-type polymerization initiator is also preferable. Specific examples thereof include the initiators described in paragraphs [0049] to [0052] of WO2017/170443A.

<Solvent>

It is preferable that the present composition includes a solvent from the viewpoint of workability in formation of an optically anisotropic layer, and the like.

Examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide). The solvents may be used singly or in combination of two or more kinds thereof.

<Leveling Agent>

It is preferable that the present composition includes a leveling agent from the viewpoint that the surface of an optically anisotropic layer is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Examples of the leveling agent include the compounds described in paragraphs [0079] to [0102] of JP2007-069471A, the compound represented by General Formula (I) described in JP2013-047204A (in particular, the compounds described in paragraphs [0020] to [0032], the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). Furthermore, the leveling agent may also function as an alignment control agent which will be described later.

<Alignment Control Agent>

The present composition may include an alignment control agent as necessary.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent and a high-molecular-weight alignment control agent can be used.

With regard to the low-molecular-weight alignment control agent, reference can be made to the description in, for example, paragraphs [0009] to [0083] of JP2002-20363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Moreover, examples of an alignment control agent which forms or accelerates a homeotropic alignment include a boronic acid compound and an onium salt compound. With regard to the alignment control agent, reference can be made to the description in the compounds described in paragraphs [0023] to [0032] of JP2008-225281A, paragraphs [0052] to [0058] of JP2012-208397A, paragraphs [0024] to [0055] of JP2008-026730A, and paragraphs [0043] to [0055] of JP2016-193869A, the contents of which are hereby incorporated by reference.

On the other hand, the cholesteric alignment can be achieved by adding a chiral agent to the present composition, and it is possible to control the direction of revolution of the cholesteric alignment by its chiral direction.

Incidentally, the pitch of the cholesteric alignment in accordance with the alignment regulating force of the chiral agent may be controlled.

In a case where the present composition includes an alignment control agent, a content thereof is preferably 0.01% to 10% by mass, and more preferably 0.05% to 5% by mass with respect to the mass of the total solid content of the composition. In a case where the content is within the range, it is possible to obtain a uniform and highly transparent cured product, in which precipitation or phase separation, alignment defects, and the like are suppressed while a desired alignment state is achieved.

<Other Liquid Crystal Compounds>

The present composition may include other liquid crystal compounds, in addition to the rod-like liquid crystal compound and the monofunctional compound, each mentioned above.

Examples of such other liquid crystal compounds include a liquid crystal compound having two or more polymerizable groups and having forward wavelength dispersion.

In a case where the present composition includes another liquid crystal compound, a content of such another liquid crystal compound is preferably 1 to 200 parts by mass, and more preferably 5 to 100 parts by mass with respect to 100 parts by mass of the rod-like liquid crystal compound.

<Other Components>

The present composition may include components other than the above-mentioned components. Examples of such other components include a surfactant, a tilt angle control agent, an alignment assistant, a plasticizer, and a crosslinking agent.

[Method for Forming Optically Anisotropic Layer]

The optically anisotropic layer of the embodiment of the present invention is a cured product obtained by curing the above-mentioned present composition and immobilizing the alignment state of the rod-like liquid crystal compound.

Examples of a method for forming the cured product include a method in which the above-mentioned composition is used to cause a desired alignment state, and then immobilized by polymerization.

Here, the polymerization conditions are not particularly limited, but in the polymerization by irradiation with light, ultraviolet rays are preferably used. The irradiation dose is preferably 10 $mJ/cm^2$ to 50 $J/cm^2$, more preferably 20 $mJ/cm^2$ to 5 $J/cm^2$, still more preferably 30 $mJ/cm^2$ to 3 $J/cm^2$, and particularly preferably 50 $mJ/cm^2$ to 1,000 $mJ/cm^2$. In addition, the polymerization may be carried out under a heating condition in order to accelerate the polymerization reaction.

In addition, the optically anisotropic layer can be formed on any of supports or alignment films in the optical film which will be described later or a polarizer in the polarizing plate which will be described later.

[Physical Properties of Optically Anisotropic Layer]

The optically anisotropic layer of the embodiment of the present invention preferably shows a diffraction peak derived from a periodic structure in X-ray diffraction measurement.

Here, suitable examples of an aspect exhibiting the above-mentioned diffraction peak include an aspect in which molecules adjacent in the direction vertical to the alignment axis form a layer and this layer is laminated in the direction parallel to the alignment axis, that is, an aspect exhibiting a smectic phase. Furthermore, from the viewpoint that the smectic phase is easily expressed, it is preferable that the rod-like liquid crystal compound is a compound exhibiting a smectic phase in any of a case where the temperature is elevated and a case where the temperature is lowered.

In addition, whether or not the above-mentioned diffraction peak is exhibited can also be confirmed by observing a texture characteristic of a liquid crystal phase having a periodic structure with a polarizing microscope.

The alignment state of the rod-like liquid crystal compound in the optically anisotropic layer is immobilized in a state of being vertically aligned with respect to the main surface of the optically anisotropic layer.

In addition, in the present specification, the "vertical alignment" means that the main surface of an optically anisotropic layer (or in a case where the optically anisotropic layer is formed on a member such as a support and an alignment film, a surface of the member) and the major axis direction of the rod-like liquid crystal compound are vertical. Incidentally, it is not required for the both to be strictly vertical, and in the present specification, the expression means that the both are aligned at an angle formed by the major axis direction of the rod-like liquid crystal compound and the main surface of the optically anisotropic layer of 70° or more.

In the optically anisotropic layer, the angle formed by the major axis direction of the rod-like liquid crystal compound and the main surface of the optically anisotropic layer is preferably 87° to 90°, more preferably 88° to 90°, and still more preferably 89° to 90°.

In addition, the optically anisotropic layer of the embodiment of the present invention. is preferably a positive A-plate or a positive C-plate, and more preferably the positive C-plate.

Here, the positive A-plate (A-plate which is positive) and the positive C-plate (C-plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A-plate satisfies the relationship of Expression (A1) and the positive C-plate satisfies the relationship of Expression (C1). In addition, the positive A-plate has an Rth showing a positive value and the positive C-plate has an Rth showing a negative value.

$$nx>ny\approx nz \quad \text{Expression (A1)}$$

$$nz>nx\approx ny \quad \text{Expression (C1)}$$

Furthermore, the symbol, "≈" encompasses not only a case where the both sides are completely the same as each other but also a case where the both are substantially the same as each other.

In the expression, "substantially the same", with regard to the positive A-plate, for example, a case where (ny−nz)×d (in which d is the thickness of a film) is −10 to 10 nm, and preferably −5 to 5 um is also included in "ny≈nz", and a case where (nx−nz)×d is −10 to 10 nm, and preferably −5 to 5 nm is also included in "nx≈nz". In addition, with regard to the positive C-plate, for example, a case where (nx−ny)×d (in which d is the thickness of a film) is 0 to 10 nm, and preferably 0 to 5 nm is also included in "nx≈ny".

In a case where the optically anisotropic layer is a positive A-plate, the Re(550) is preferably 100 to 180 nm, more preferably 120 to 160 nm, still more preferably 130 to 150 nm, and particularly preferably 130 to 140 nm from the viewpoints that the optically anisotropic layer functions as a λ/4 plate and the optically anisotropic layer functions as a view angle compensation plate for a liquid crystal cell.

Here, the "λ/4plate" is a plate having a λ/4 function, specifically, a plate having a function of converting a linearly polarized light at a certain specific wavelength into a circularly polarized light (or converting a circularly polarized light to a linearly polarized light).

In a case where the optically anisotropic layer is a positive C-plate, the Rth(550) is preferably −160 to −10 nm, more preferably −150 to −20 nm, still more preferably −150 to −50 nm, particularly preferably −150 to −70 nm, and more particularly preferably −130 nm to −70 nm from the viewpoints that the oblique reflectance of the λ/4 plate can be reduced and the oblique light leakage of the view angle compensation plate of the liquid crystal cell can be reduced.

Furthermore, the values of the in-plane retardation (Re) and the thickness-direction retardation (Rth) refer to values measured with light at the measurement wavelength using AxoScan OPMF-1 (manufactured by Opto Science, Inc.).

Specifically, by inputting the average refractive index ((Nx+Ny+Nz)/3) and the film thickness (d(μm)) to AxoScan OPMF-1, it is possible to calculate:

Slow axis direction (°)

Re(λ)=R0(λ)

Rth(λ)=((nx+ny)/2−nz)×d.

Moreover, R0(λ) is expressed in a numerical value calculated with AxoScan OPMF-1, but means Re(λ). Re(λ) is represented by (nx−ny)×d.

[Optical Film]

The optical film of an embodiment of the present invention is an optical film having the optically anisotropic layer of the embodiment of the present invention.

The structure of the optical film will be described with reference to FIG. 1. FIG. 1 is a schematic cross-sectional view showing an example of the optical film.

Furthermore, FIG. 1 is a schematic view, and the thicknesses relationship, the positional relationship, and the like among the respective layers are not necessarily consistent with actual ones, and either of the support shown in FIG. 1 and an alignment film are optional constitutional members.

An optical film 10 shown in FIG. 1 has a support 16, an alignment film 14, and an optically anisotropic layer 12 as the cured product of the present composition in this order.

In addition, the optically anisotropic layer 12 may be a laminate of two or more different optically anisotropic layers. For example, in a case where the polarizing plate of the embodiment of the present invention which will be described later is used as a circularly polarizing plate or in a case where the optical film of the embodiment of the present invention is used as an optical compensation film for an IPS mode or an FFS mode liquid crystal display device, the optically anisotropic layer 12 is preferably a laminate of a positive A-plate and a positive C-plate.

For the Re (550) of the positive A-plate, the above-mentioned numerical value range is preferable. The Re (450)/Re (550) of the positive A-plate is preferably 0.6 to 1.25, more preferably 0.8 to 1.1, and still more preferably 0.8 to 0.9. The Re (650)/Re (550) of the positive A-plate is preferably 0.7 to 1.25, more preferably 0.9 to 1.18, and still more preferably 1 to 1.1.

The Rth (550) of the positive C-plate is preferably in the above-mentioned numerical value range. The Rth (450)/Rth (550) of the positive C-plate is preferably 0.6 to 1.25, more preferably 0.8 to 1.1, and still more preferably 0.8 to 0.9. The Rth (650)/Rth (550) of the positive C-plate is preferably 0.7 to 1.25, more preferably 0.9 to 1.18, and still more preferably 1 to 1.1.

The optically anisotropic layer may be used with a support, or may be used in a state where another optically anisotropic layer is laminated thereon for the purpose of improving display performance.

In addition, the optically anisotropic layer may be peeled from the support, and the optically anisotropic layer may be used alone as an optical film.

Hereinafter, various members used for the optical film will be described in detail.

[Optically Anisotropic Layer]

An optically anisotropic layer contained in the optical film of the embodiment of the present invention is the above-mentioned optically anisotropic layer of the embodiment of the present invention.

In the optical film, a thickness of the optically anisotropic layer is not particularly limited, but is preferably 0.1 to 10 μm, and more preferably 0.5 to 5 μm.

[Support]

The optical film may have a support as a base material for forming an optically anisotropic layer as described above.

Such a support is preferably transparent. Specifically, the light transmittance is preferably 80% or more.

Examples of such a support include a glass substrate and a polymer film. Examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

A thickness of the support is not particularly limited, but is preferably 5 to 60 μm, and more preferably 5 to 40 μm.

In addition, the Function of the support is not particularly limited, and may be a layer having a function, such as a stress relaxation layer, a protective layer, an alignment layer, a flattening layer, and a refractive index adjusting layer.

In addition, as the optical characteristics of the support, a low retardation film satisfying the following expression is preferable for a reason that the display performance is improved. The support having such optical characteristics may be provided between the optically anisotropic layer and the polarizer, or may be provided between the optically anisotropic layer and the liquid crystal cell. In other words, a layer configuration of the polarizing plate which will be described later may be one having the optically anisotropic layer, the support, and the polarizer in this order, or the layer configuration of the liquid crystal display device which will be described later may be one having the polarizer, the optically anisotropic layer, the support, and the liquid crystal cell.

$$0\ \text{nm} \leq Re(550) \leq 10\ \text{nm}$$

$$-40\ \text{nm} \leq Rth(550) \leq 40\ \text{nm}$$

[Alignment Film]

In the optical film, the optically anisotropic layer is preferably formed on the surface of an alignment film. In a case where the optical film has any of the above-mentioned supports, the alignment film may be sandwiched between the support and the optically anisotropic layer. In addition, an aspect in which the above-mentioned support may also function as an alignment film is also available.

[Ultraviolet Absorber]

The optical film preferably includes an ultraviolet (UV) absorber, taking an effect of external light (particularly ultraviolet rays) into consideration.

The ultraviolet absorber may be included in the optically anisotropic layer or may also be included in a member other than the optically anisotropic layer, constituting the optical film. Suitable examples of the member other than the optically anisotropic layer include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferable from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths are also preferably used in combination.

Examples of the ultraviolet absorber Include the compounds described in paragraphs [0258] and [0259] of JP2012-18395A and the compounds described in paragraphs [0055] to of JP2007-72163A.

In addition, as a commercially available product thereof, for example, Tinuvin 400, Tinuvin 405, Tinuvin 460, Tinuvin 477, Tinuvin 479, and Tinuvin 1577 (all manufactured by BASE), or the like can be used.

[Polarizing Plate]

The polarizing plate of an embodiment of the present invention has the above-mentioned optical film of the embodiment of the present invention and a polarizer.

In a case where the above-mentioned optically anisotropic layer is a λ/4 plate (positive A-plate), the polarizing plate can be used as a circularly polarizing plate.

In a case where the polarizing plate is used as a circularly polarizing plate, the above-mentioned optically anisotropic layer is used as a λ/4 plate (positive A-plate), and an angle between the slow axis of the λ/4 plate and the absorption axis of a polarizer which will be described later is preferably 30° to 60°, more preferably 40° to 50°, still more preferably 42° to 48°, and particularly preferably 45°.

Here, the “slow axis” of the λ/4 plate means a direction in which the refractive index in the plane of the λ/4 plate is maximum, and the “absorption axis” of the polarizer means a direction in which the absorbance is highest.

In addition, the polarizing plate can also be used as an optical compensation film for an IPS mode or FFS mode liquid crystal display device.

In a case where the polarizing plate is used as an optical compensation film for an IPS mode or FPS mode liquid crystal display device, it is preferable that the above-mentioned optically anisotropic layer is used as at least one plate of a laminate of a positive A-plate and a positive C-plate, an angle formed by the slow axis of the positive A-plate layer and the absorption axis of a polarizer which will be described later are orthogonal or parallel, and specifically, it is more preferable that an angle formed by the slow axis of the positive A-plate layer and the absorption axis of the polarizer which will be described later is 0° to 5° or 85° to 95°.

In addition, in a case where the optical compensation film has a polarizer, a positive C-plate, and a positive A-plate laminated in this order, it is more preferable that an angle formed by the slow axis of the positive A-plate and the absorption axis of the polarizer is parallel to each other.

Similarly, in a case where the optical compensation film has a polarizer, a positive A-plate, and a positive C-plate laminated in this order, it is more preferable that an angle formed by the slow axis of the positive A-plate and the absorption axis of the polarizer is orthogonal to each other.

In a case where the polarizing plate of the embodiment of the present invention is used in a liquid crystal display device which will be described later, it is preferable that an angle formed by the slow axis of the optically anisotropic layer and the absorption axis of a polarizer which will be described later is parallel or orthogonal.

In addition, in the present specification, a term "parallel" does not require that the both are strictly parallel, but means that an angle between one and the other is less than 10°. In addition, in the present specification, a term "orthogonal" does not require that the both are strictly orthogonal, but means that the angle between one and the other is more than 80° and less than 100°.

[Polarizer]

The polarizer contained in the polarizing plate is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-haled polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dying in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

Examples of the coating type polarizer include those in WO2018/124198A, WO2018/186503A, WO2019/132020A, WO2019/132018A, WO2019/189345A, JP2019-197168A, JP2019-194685A, and JP2019-139222A, and known techniques relating to these polarizers can also be preferably used.

A polarizer in which thin films having different birefringence are laminated, a wire grid-type polarizer, a polarizer having a combination of a cholesteric liquid crystal having a selective reflection range, a ¼ wavelength plate, and the like is used as the reflective type polarizer.

Among those, a polarizer including a polyvinyl alcohol-based resin (a polymer including $-CH_2-CHOH-$ as a repeating unit, in particular, at least one selected from the group consisting of a polyvinyl alcohol and an ethylene-vinyl alcohol copolymer) is preferable from the viewpoint that the adhesiveness is more excellent.

In addition, from the viewpoint of imparting crack resistance, the polarizer may have a depolarization unit formed along the opposite end edges. Examples of the depolarization unit include JP2014-240970A.

In addition, the polarizer may have non-polarizing parts arranged at predetermined intervals in the longitudinal direction and/or the width direction. The non-polarizing part is a decolorized part which is partially decolorized. The arrangement pattern of the non-polarizing parts can be appropriately set according to a purpose. For example, the non-polarizing parts are arranged at a position corresponding to a camera unit of an image display device in a case where a polarizer is cut (cut, punched, or the like) to a predetermined size in order to be attached to the image display device in a predetermined size. Examples of the arrangement pattern of the non-polarizing parts include those in JP2016-27392A.

A thickness of the polarizer is not particularly limited, but is preferably 3 to 60 μm, more preferably 3 to 30 μm, and still more preferably 3 to 10 μm.

[Pressure-Sensitive Adhesive Layer]

The polarizing plate may have a pressure-sensitive adhesive layer arranged between the optically anisotropic layer in the optical film and the polarizer.

Examples of a material forming the pressure-sensitive adhesive layer used for lamination of the cured product and the polarizer include a member formed of a substance in which a ratio ($\tan\delta = G''/G'$) between a storage elastic modulus G' and a loss elastic modulus G", each measured with a dynamic viscoelastometer, is 0.001 to 1.5, in which a so-called pressure-sensitive adhesive and a readily creepable substance are included. Examples of the pressure-sensitive adhesive include a polyvinyl alcohol-based pressure-sensitive adhesive, but the pressure-sensitive adhesive is not limited thereto.

The function of such a pressure-sensitive adhesive layer is not particularly limited, and may be a layer having a function, such as a stress relaxation layer, a protective layer, an alignment layer, a flattening layer, and a refractive index adjusting layer.

In addition, it is preferable that the refractive index of the pressure-sensitive adhesive layer is close to the refractive index of the optically anisotropic layer from the viewpoint of reducing the reflectance. On the other hand, by controlling the difference in the refractive index between the optically anisotropic layer and the pressure-sensitive adhesive layer, structural birefringence can be controlled, and preferred optical compensation characteristics can be realized.

[Adhesive Layer]

In the polarizing plate, an adhesive layer may be arranged between the optically anisotropic layer in the optical film and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 μm, more preferably 0.01 to 10 μm, and still more preferably 0.05 to 5 μm. In a case where the thickness of the adhesive layer is within this range, floating or peeling does not occur between the protective layer or optically anisotropic layer and the polarizer, which are laminated, and a practically acceptable adhesive force can be obtained. In addition, the thickness of the adhesive layer is preferably 0.4 μm or more from the viewpoint that the generation of air bubbles can be suppressed.

Moreover, from the viewpoint of durability, a bulk water absorption rate of the adhesive layer may be adjusted to 10% by mass or less, and is preferably 2% by mass or less. The bulk water absorption rate is measured according to the water absorption rate testing method described in JIS K 7209.

With regard to the adhesive layer, reference can be made to, for example, the description in paragraphs [0062] to [0080] of JP2016-35579A, the contents of which are incorporated herein by reference.

The function of such an adhesive layer is not particularly limited, and may be a layer having a function, such as a stress relaxation layer, a protective layer, an alignment layer, a flattening layer, and a refractive index adjusting layer.

In addition, it is preferable that the refractive index of the adhesive layer is close to the refractive index of the optically anisotropic layer from the viewpoint of reduction in the reflectance. On the other hand, by controlling the difference in the refractive index between the optically anisotropic layer and the adhesive layer, structural birefringence can be controlled, and preferable optical compensation characteristics can be realized.

[Easy Adhesion Layer]

In the polarizing plate, an easy adhesion layer may be arranged between the optically anisotropic layer in the optical film and the polarizer. A storage elastic modulus of the easy adhesion layer at 85° C. is preferably $1.0\times10^6$ Pa to $1.0\times10^7$ Pa from the viewpoints that the adhesiveness between the optically anisotropic layer and the polarizer is excellent and the generation of cracks in the polarizer is suppressed. Examples of the constituent material of the easy adhesion layer include a polyolefin-based component and a polyvinyl alcohol-based component. A thickness of the easy adhesion layer is preferably 500 nm to 1 μm.

With regard to the easy adhesion layer, reference can be made to, for example, the description in paragraphs [0048] to [0053] of JP2018-36345A, the contents of which are incorporated herein by reference.

[Image Display Device]

An image display device of an embodiment of the present invention is an image display device having the optical film of the embodiment of the present invention or the polarizing plate of the embodiment of the present invention.

A display element used in the image display device is not particularly limited, and examples thereof include a liquid crystal cell, an organic electroluminescent (hereinafter simply referred to as "electroluminescence (EL)") display panel, and a plasma display panel. Among those, the liquid crystal cell and the organic EL display panel are preferable, and the liquid crystal cell is more preferable.

That is, as the image display device, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device is a liquid crystal display device having the above-mentioned polarizing plate and a liquid crystal cell.

Furthermore, it is preferable that the above-mentioned polarizing plate is used as the polarizing plate of the front side, and it is more preferable that the above-mentioned polarizing plate is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used in the liquid crystal display device is a vertical alignment (VA) mode, an optically compensated bend (OCB) mode, an in-plane-switching (IPS) mode, a fringe-field-switching (FFS) mode, or a twisted nematic (TN) mode is preferred, but is not limited to these.

In a TN-mode liquid crystal cell, rod-like liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-like liquid crystal molecules are substantially vertically aligned during no voltage application thereto. Examples of the VA-mode liquid crystal cell include (1) a VA-mode liquid crystal cell in the narrow sense of the word, in which rod-like liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for view angle enlargement (described in SID97, Digest of tech. Papers (preprint), 28 (1997) 845), (3) a liquid crystal cell in a mode (n-ASM mode) in which rod-like liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell (announced in LCD international 98). In addition, the liquid crystal cell in the VA mode may be any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-like liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the view angle by reducing light leakage during black display in an oblique direction using an optical compensation sheet is disclosed in JP1998-54982A (JP-H10-54982A), JP-1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Examples of the organic EL display device which is an example of the image display device include an aspect which includes, from the visible side, a polarizer, a λ/4 plate (a positive A-plate) consisting of the above-mentioned optically anisotropic layer, and an organic EL display panel in this order.

In addition, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinbelow, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

Example 1

[Manufacture of Protective Film 1]

<Preparation of Core Layer Cellulose Acylate Dope 1>

The following composition was put into a mixing tank and stirred to dissolve the respective components to prepare a core layer cellulose acylate dope 1.

Core Layer Cellulose Acylate Dope 1

| | |
|---|---|
| Cellulose acetate having a degree of acetyl substitution of 2.88 | 100 parts by mass |
| The following polyester | 12 parts by mass |
| The following durability improver | 4 parts by mass |
| Methylene chloride (the first solvent) | 430 parts by mass |
| Methanol (the second solvent) | 64 parts by mass |

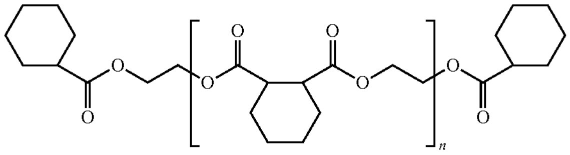

Polyester (number-average molecular weight of 800)

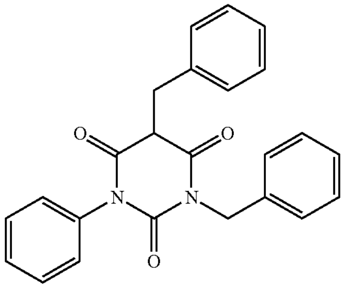

Durability improver

<Preparation of Outer Layer Cellulose Acylate Dope 1>

10 parts by mass of the following matting agent dispersion liquid 1 was added to 90 parts by mass of the core layer cellulose acylate dope 1 to prepare an outer layer cellulose acylate dope 1.

Matting Agent Dispersion Liquid 1

| | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope 1 | 1 part by mass |

<Manufacture of Protective Film 1>

The core layer cellulose acylate dope 1 and the outer layer cellulose acylate dope 1 were filtered, using a filter paper with an average pore diameter of 34 μm and a sintered metal filter with an average pore diameter of 10 μm. Then, the core layer cellulose acylate dope 1 and the outer layer cellulose acylate dopes 1 on both sides thereof were cast simultaneously on a drum at 20° C. from a casting port in three layers, using a band casting machine.

Subsequently, the film was peeled from the drum in a state where a solvent content of the film on the drum was approximately 20% by mass. Both ends of the obtained film in the width direction were immobilized with tenter clips, and the film was dried while being stretched 1.1 times in the width direction in a state where the solvent content of the film was 3% to 15% by mass.

Then, the obtained film was transported between rolls of a heat treatment device and further dried to manufacture a cellulose acylate film 1 with a film thickness of 40 μm, which was used as a protective film 1. The results of measuring a phase difference of the protective film 1 were as follows: Re=1 nm and Rth=−5 nm.

[Manufacture of Optically Anisotropic Layer A1]

<Preparation of Composition 1 for Photo-Alignment Film>

8.4 parts by mass of the following copolymer C3 and 0.3 parts by mass of the following thermal acid generator D1 were added to a mixed liquid including 80 parts by mass and 20 parts by mass of butyl acetate and methyl ethyl ketone, respectively, to prepare a composition 1 for a photo-alignment film.

Copolymer C3 (weight-average molecular weight: 40,000, the numerical value in the following formula indicates a content (% by mass) of each repeating unit)

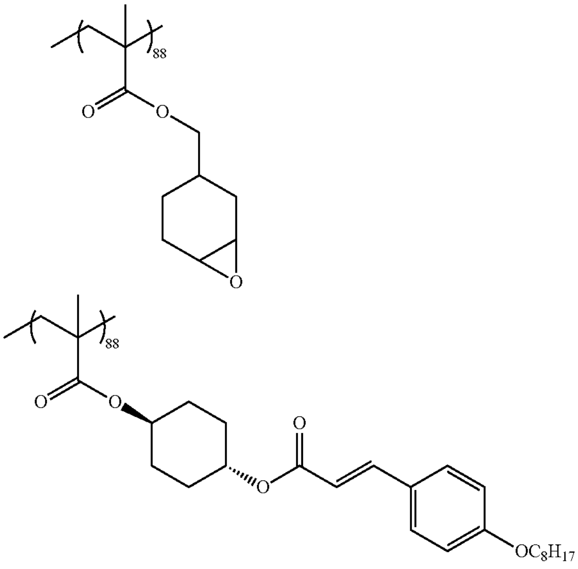

Thermal acid generator D1

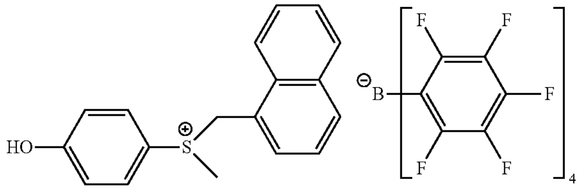

<Preparation of Polymerizable Liquid Crystal Composition A1>

A polymerizable liquid crystal composition A1 for forming an optically anisotropic layer A1 having the following composition was prepared.

Polymerizable Liquid Crystal Composition A1

| | |
|---|---|
| The following rod-like liquid crystal compound R1 | 40.0 parts by mass |
| The following rod-like liquid crystal compound R2 | 20.0 parts by mass |
| The following rod-like liquid crystal compound R3 | 20.0 parts by mass |
| The following rod-like liquid crystal compound R4 | 20.0 parts by mass |
| The following monofunctional compound A1 | 12.0 parts by mass |
| The following polymerization initiator S1 | 0.5 parts by mass |
| The following leveling agent P1 | 0.2 parts by mass |
| Cyclopentanone | 202.5 parts by mass |
| Methyl ethyl ketone | 60.5 parts by mass |

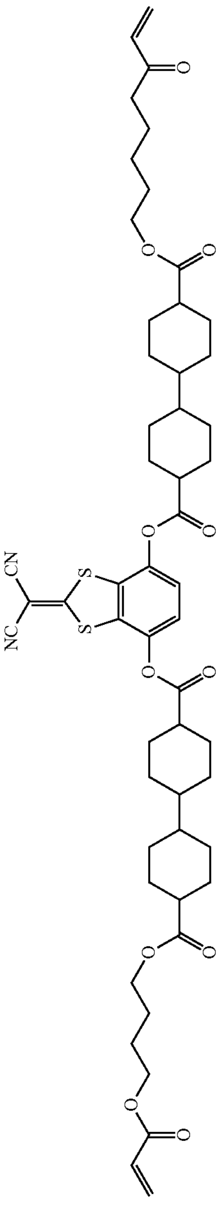
Rod-like liquid crystal compound R1
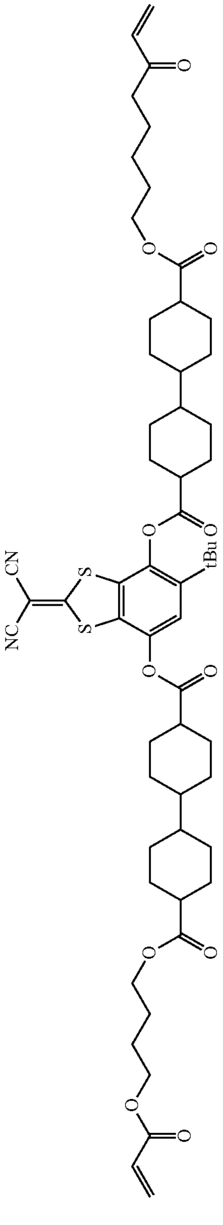
Rod-like liquid crystal compound R2
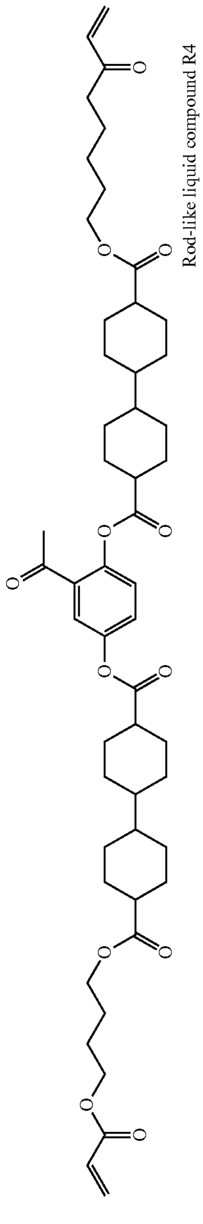
Rod-like liquid crystal compound R3
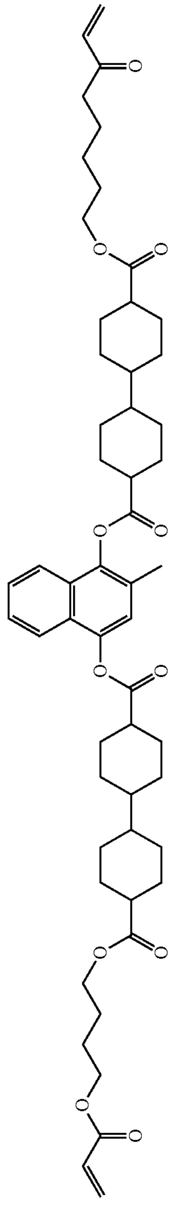
Rod-like liquid compound R4

-continued
Monofunctional compound A1
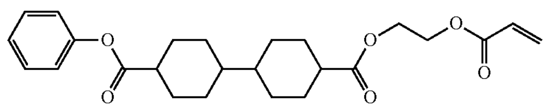
Polymerization initiator S1
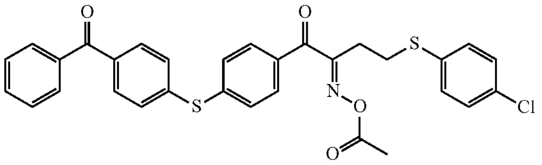
Leveling agent P1
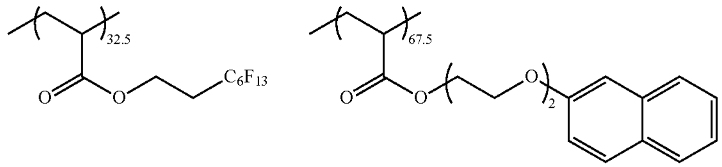
(in the following formula: 32.5 and 67.5 indicate contents (% by mass) of the respective repeating units with respect to all repeating units in the leveling agent P1)

<Manufacture of Optically Anisotropic Layer A1>

The composition 1 for the photo-alignment film prepared in advance was applied onto a surface on one side of the manufactured protective film 1, using a bar coater. Then, the film was dried on a hot plate at 80° C. for 5 minutes to remove the solvent, thereby forming a photoisomerization composition layer with a thickness of 0.2 μm. The obtained photoisomerization composition layer was irradiated with polarized ultraviolet rays (10 mJ/$cm^2$, using an ultra-high-pressure mercury lamp) to form a photo-alignment film 1 with a thickness of 0.2 μm.

Subsequently, the polymerizable liquid crystal composition A1 prepared in advance was applied onto a surface of the photo-alignment film A1 with a bar coater to form a composition layer. The formed composition layer was heated on a hot plate to a temperature exhibiting an isotropic phase, and then cooled to stabilize the alignment at a temperature exhibiting a smectic phase. Thereafter, while maintaining the temperature, the alignment was immobilized by irradiation with ultraviolet rays (300 mJ/$cm^2$, using an ultra-high-pressure mercury lamp) in a nitrogen atmosphere (an oxygen concentration of 100 ppm) to manufacture an optically anisotropic layer A1 with a thickness of 2.5 μm.

Furthermore, in a case where the manufactured optically anisotropic layer A1 was peeled from the protective film 1 and the photo-optical alignment film 1, and a phase difference of the optically anisotropic layer A1 was measured, it was confirmed that an in-plane retardation ReA(550) was 140 nm, ReA(450)/ReA(550) was 0.86, ReA(650)/ReA (550) was 1.02, and the optically anisotropic layer A1 was a positive A-plate.

[Manufacture of Optically Anisotropic Layer C1]

<Preparation of Polymerizable Liquid Crystal Composition C1>

A polymerizable liquid crystal composition C1 for forming an optically anisotropic layer C1 having the following composition Was prepared.

Polymerizable Liquid Crystal Composition C1

| | |
|---|---|
| The rod-like liquid crystal compound R1 | 100.0 parts by mass |
| The monofunctional compound A1 | 20.0 parts by mass |
| The following compound B1 | 3.0 parts by mass |
| The following compound C1 | 8.0 parts by mass |
| The polymerization initiator S1 | 3.0 parts by mass |
| The following leveling agent P2 | 0.3 parts by mass |
| The following leveling agent P3 | 0.3 parts by mass |
| Cyclopentanone | 913.9 parts by mass |
| Methanol | 28.3 parts by mass |

Compound B1

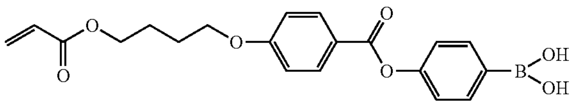

-continued

Compound C1

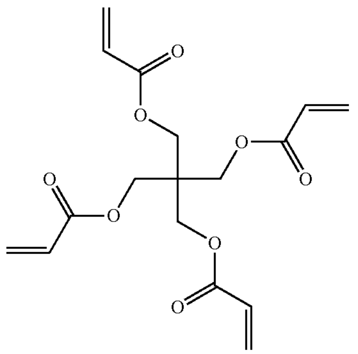

Leveling agent P2 [weight-average molecular weight: 15,000 the numerical values in the following formulae indicate contents (% by mass) of the respective repeating units with respect to all the repeating units]

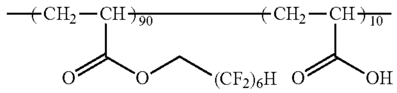

Leveling agent P3 [weight-average molecular weight: 11,200 the numerical values in the following formulae indicate contents (% by mass) of the respective repeating units with respect to all the repeating units]

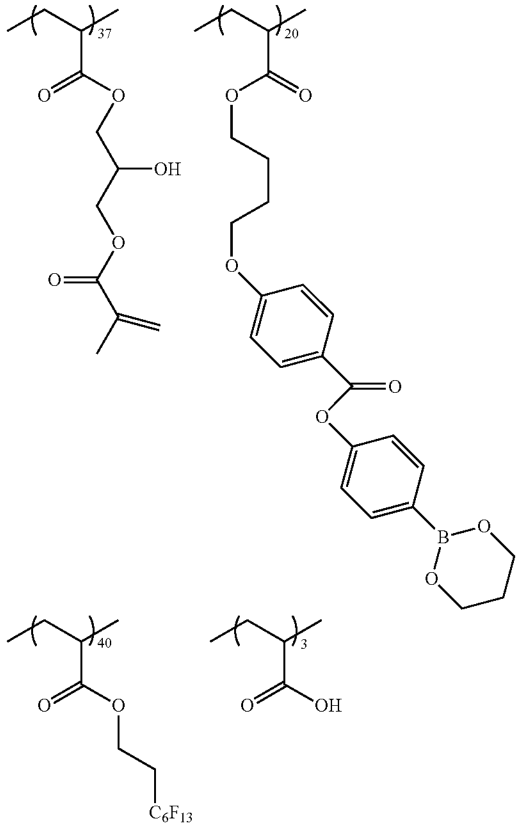

<Manufacture of Optically Anisotropic Layer C1>

A surface of the manufactured optically anisotropic layer A1 was subjected to a corona treatment with a discharge amount of 150 W•min/$m^2$, and the polymerizable liquid crystal composition C1 previously prepared was applied onto the corona-treated surface with a bar coater to form a composition layer. Subsequently, heating was performed with warm air at 85° C. for 60 seconds in order to dry the solvent of the composition and subject the liquid crystal compound to alignment-aging. The alignment was immobilized through irradiation with ultraviolet rays (150 mJ/$cm^2$) at an oxygen concentration of 100 ppm under a nitrogen purge at 50° C. to manufacture an optically anisotropic layer C1 having a thickness of 2.0 μm, and optical films (phase difference films) having the protective film 1, the photo-alignment film 1, the optically anisotropic layer A1, and the optically anisotropic layer C1 in this order were obtained.

Furthermore, the protective film 1 and the photo-alignment film 1 were peeled from the manufactured phase difference film, the phase difference of the laminate (the optically anisotropic layer C1/the optically anisotropic layer A1) was measured, the previously measured phase difference of the optically anisotropic layer A1 was subtracted therefrom to calculate a phase difference of the optically anisotropic layer C1, and thus, it was confirmed that the retardation RthC(550) in the thickness direction was −90 nm. RthC(450)/RthC(550) was 0.64, RthC(650)/RthC (550) was 1.08, and the optically anisotropic layer C1 was a positive C-plate.

[Manufacture of Protective Film 2]

The following composition was put into a mixing tank and stirred under heating to dissolve the respective components to prepare a cellulose acetate solution.

Cellulose Acetate Solution

| | |
|---|---|
| Cellulose acetate having an acetylation degree of 60.7% to 61.1% | 100 parts by mass |
| Triphenyl phosphate (plasticizer) | 7.8 parts by mass |
| Biphenyl diphenyl phosphate (plasticizer) | 3.9 parts by mass |
| Methylene chloride (the first solvent) | 336 parts by mass |
| Methanol (the second solvent) | 29 parts by mass |
| 1-Butanol (the third solvent) | 11 parts by mass |

16 parts by mass of the following retardation increasing agent (A), 92 parts by mass of methylene chloride, and 8 parts by mass of methanol were put into another mixing tank, and the mixture was stirred under heating to prepare a retardation increasing agent solution. 474 parts by mass of a cellulose acetate solution was Mixed with 25 parts by mass of a retardation increasing agent solution, and the mixture was sufficiently stirred to prepare a dope. The amount of the retardation increasing agent added was 6.0 parts by mass with respect to 100 parts by mass of cellulose acetate.

Retardation increasing agent (A)

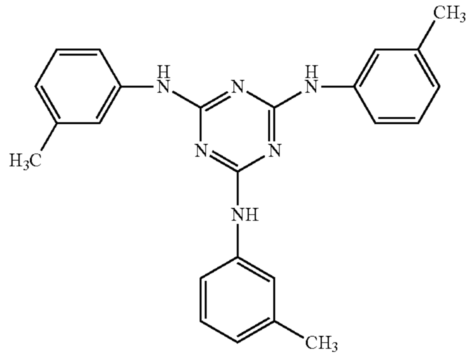

The obtained dope was cast using a band drawing machine. After the film surface temperature on the band reaches 40° C., the film was dried with hot air at 70° C. for 1 minute, and the film was dried from the band with dry air at 140° C. for 10 minutes to manufacture having a triacetyl cellulose film having a residual solvent amount of 0.3% by mass. A film thickness thereof was 41 μm. This film was taken as a protective film 2.

As a result of the measurement of the phase difference of the protective film 2, Re=1 nm and Rth=40 nm were obtained.

<Saponification Treatment of Protective Film 2>

The protective film 2 manufactured above was immersed in a 2.3 mol/L aqueous sodium hydroxide solution at 55° C. for 3 minutes. Then, the film was washed in a water-washing bath at room temperature and neutralized at 30° C. with 0.05 mol/L sulfuric acid. The film was washed again in a water-washing bath at room temperature, and further dried with hot air at 100° C., and a surface of the protective film 2 was saponified.

[Manufacture of Polarizing Plate]

The saponified protective film 2 manufactured above, a polyvinyl alcohol-based polarizer, and a phase difference film manufactured were stuck with each other, using an adhesive, so that the absorption axis of the polarizer and the slow axis of the phase difference film were in parallel directions and the optically anisotropic layer C1 side of the phase difference film was on the polarizer side, and then the protective film 1 and the photo-alignment film 1 were peeled, thereby manufacturing a first polarizing plate of Example 1. Furthermore, as the adhesive, a 3% aqueous PVA solution (manufactured by Kuraray Ltd., PVA-117H) was used. At this time, the adhesiveness between the polarizer and the phase difference film in the first polarizing plate was sufficiently sufficient for practical use.

In addition, a second polarizing plate was manufactured by similarly sticking the saponified protective film 2, a polyvinyl alcohol-based polarizer, and the saponified protective film 2 in the same procedure.

[Manufacture of Liquid Crystal Display Device]

A commercially available liquid crystal display device (iPad, manufactured by Apple Inc.) was disassembled, a double-sided polarizing plate stuck thereto was peeled, a first polarizing plate was arranged on a visual side, and a second polarizing plate was arranged on the backlight side. At this time, a liquid crystal display device of Example 1 was manufactured by sticking the optically anisotropic layer A1 in the phase difference film of the first polarizing plate so that it was placed on the liquid crystal cell side, using a pressure-sensitive adhesive (SK2057 manufactured by Soken Kagaku Co., Ltd.). In addition, at this time, the sticking was performed so that the slow axis of the liquid crystal in the cell and the absorption axis of the first polarizing plate were orthogonal to each other, and the slow axis of the liquid crystal in the cell and the absorption axis of the second polarizing plate are parallel to each other.

[Evaluation]

<Recess Defects>

A surface of the optically anisotropic layer C1 of the phase difference film was measured in a wave mode at a magnification of 10 times of an objective lens, using a surface shape measurement system ("vertscan" R5500 manufactured by Hitachi High-Tech Science Corporation), The data was output in a 3D format, and the concave shape of the surface was evaluated according to the following evaluation standard.

A: There is almost no recess on the entire surface.

B: There are some recesses.

C: There are recesses on the entire surface.

<Haze>

The haze of the phase difference film is a haze value specified in HS-K7105, and a value based on the measurement method specified in JIS-K7361-1, Which is automatically measured as Haze H (Diffused light/Total transmitted light)×100 (%) with a turbidity meter "NDH-1001DP" manufactured by Nippon Denshoku Kogyo Co., Ltd., was used as the haze. The haze was evaluated according to the following evaluation standard.

A: The haze is less than 1%.

B: The haze is 1% or more.

<Oblique Light Leakage>

A brightness was measured for the manufactured liquid crystal display device in a black display made by notching 1° increments from an azimuthal angle of 0° (horizontal direction) to 359° in the counterclockwise direction using a measuring machine "EZ-Contrast XL88" (manufactured by ELDIM), and notching 1° increments from a polar angle of 0° (front direction) to 88°. The light leakage at azimuthal angles of 0°, 90°, 180°, and 270° and a polar angle of 60°, which are the axial directions of the polarizing plate was evaluated according to the following evaluation standard.

A: There is very little light leakage, which is particularly excellent.

B: There is little light leakage, which is excellent.

C: There is a lot of light leakage, which is unacceptable.

Example 2

An optically anisotropic layer C2 of Example 2 was manufactured by the same method as in Example 1, except that the following monofunctional compound A2 was used instead of the monofunctional compound A1 included in the polymerizable liquid crystal composition C1, thereby preparing a polymerizable liquid crystal composition C2, and each evaluation was performed.

Monofunctional compound A2

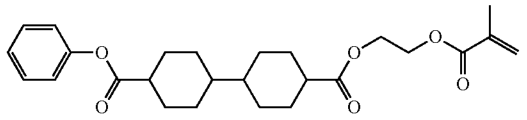

Example 3

An optically anisotropic layer C3 of Example 3 was manufactured by the same method as in Example 1, except that the following monofunctional compound A3 was used instead of the monofunctional compound A1 included in the polymerizable liquid crystal composition C1, thereby preparing a polymerizable liquid crystal composition C3, and each evaluation was performed.

Monofunctional compound A3

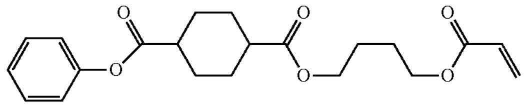

Example 4

An optically anisotropic layer C4 of Example 4 was manufactured by the same method as in Example 1, except that the following monofunctional compound A4 was used instead of the monofunctional compound A1 included in the polymerizable liquid crystal composition C1, thereby preparing a polymerizable liquid crystal composition C4, and each evaluation was performed.

Monofunctional compound A4

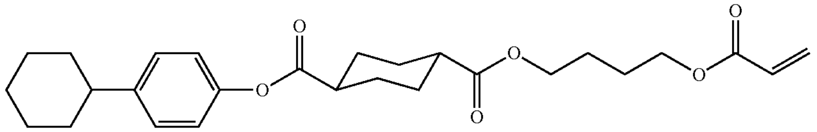

Example 5

An optically anisotropic layer C5 of Example 5 was manufactured by the same method as in Example 1, except that the following monofunctional compound A5 was used instead of the monofunctional compound A1 included in the polymerizable liquid crystal composition C1, thereby preparing a polymerizable liquid crystal composition C5, and each evaluation was performed.

Monofunctional compound A5

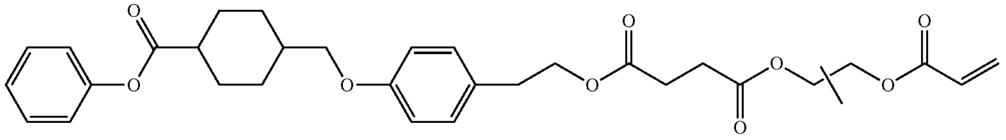

Example 6

An optically anisotropic layer C6 of Example 6 was manufactured by the same method as in Example 1, except that the following rod-like liquid crystal compound R5 was used instead of the rod-like liquid crystal compound R1 in the polymerizable liquid crystal composition C2, and methyl ethyl ketone was used instead of cyclopentanone, thereby preparing a polymerizable liquid crystal composition C6, and each evaluation was performed.

Example 8

An optically anisotropic layer C8 of Example 8 was manufactured by the same method as in Example 1, except that the rod-like liquid crystal compound R3 was used instead of the rod-like liquid crystal compound R1 included in the polymerizable liquid crystal composition C2, thereby preparing a polymerizable crystal composition C8, and each evaluation was performed.

Rod-like liquid crystal compound R5

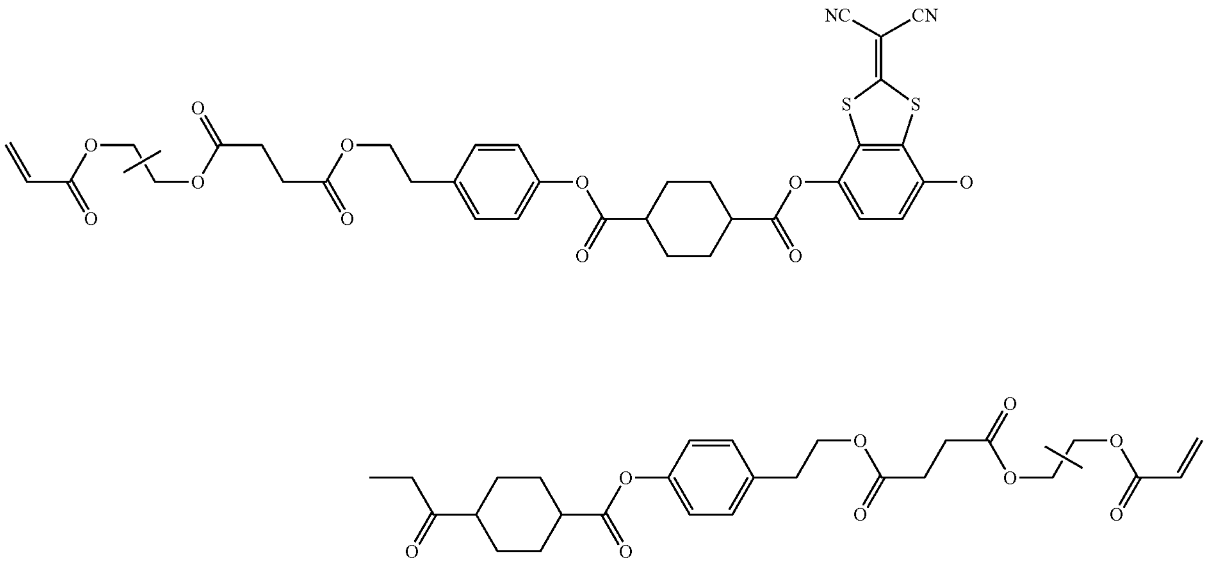

Example 7

An optically anisotropic layer C7 of Example 7 was manufactured by the same method as in Example 1, except that the following monofunctional compound A6 was used instead of the monofunctional compound A2 included in the polymerizable liquid crystal composition C6, thereby preparing a polymerizable liquid crystal composition C7, and each evaluation was performed.

Monofunctional compound A6

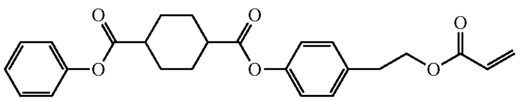

Example 9

An optically anisotropic layer C9 of Example 9 was manufactured by the same method as in Example 1, except that the rod-like liquid crystal compound R2 was used instead of the rod-like liquid crystal compound R1 included in the polymerizable liquid crystal composition C2, thereby preparing a polymerizable liquid crystal composition C9, and each evaluation was performed.

Example 10

An optically anisotropic layer C10 of Example 10 was manufactured by the same method as in Example 1, except that the following rod-like liquid crystal compound R6 was used instead of the rod-like liquid crystal compound R5 included in the polymerizable liquid crystal composition C7, thereby preparing a polymerizable liquid crystal composition C10, and each evaluation was performed.

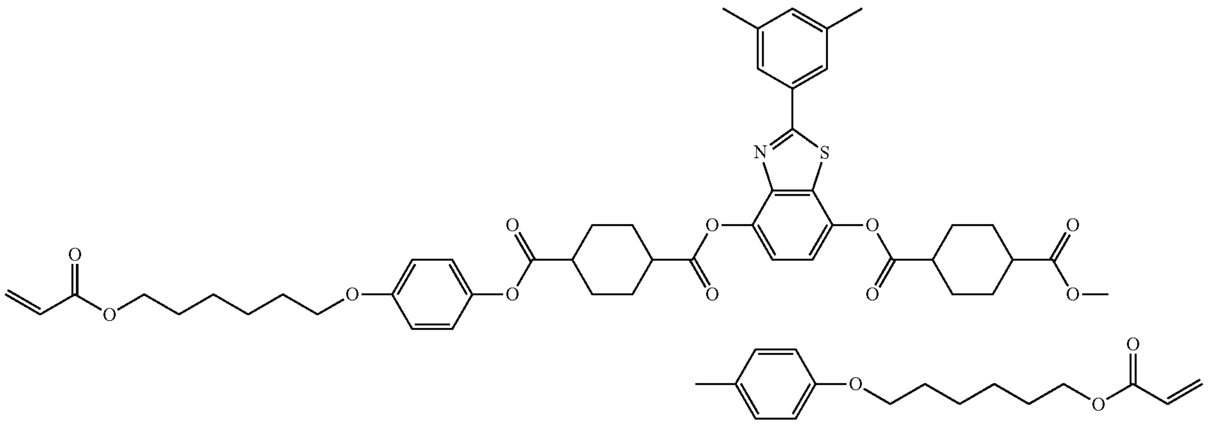

Rod-like liquid crystal compound R6

Example 11

An optically anisotropic layer C11 of Example 11 was manufactured by the same method as in Example 1, except that the polymerizable liquid crystal composition C11 having the following composition was used instead of the polymerizable liquid crystal composition C1, and each evaluation was performed.

Polymerizable Liquid Crystal Composition C11

| | |
|---|---|
| The rod-like liquid crystal compound R1 | 27.5 parts by mass |
| The rod-like liquid crystal compound R2 | 27.5 parts by mass |
| The rod-like liquid crystal compound R3 | 22.5 parts by mass |
| The rod-like liquid crystal compound R4 | 22.5 parts by mass |
| The monofunctional compound A2 | 10.0 parts by mass |
| The compound B1 | 3.0 parts by mass |
| The compound C1 | 8.0 parts by mass |
| The polymerization initiator S1 | 3.0 parts by mass |
| The leveling agent P2 | 0.3 parts by mass |
| The leveling agent P3 | 0.3 parts by mass |
| Cyclopentanone | 325.2 parts by mass |
| Methyl ethyl ketone | 37.4 parts by mass |
| Methanol | 11.2 parts by mass |

Polymerizable Liquid Crystal Composition C12

| | |
|---|---|
| The rod-like liquid crystal compound R1 | 27.5 parts by mass |
| The rod-like liquid crystal compound R2 | 27.5 parts by mass |
| The rod-like liquid crystal compound R3 | 9.0 parts by mass |
| The rod-like liquid crystal compound R4 | 27.0 parts by mass |
| The rod-like liquid crystal compound R7 | 9.0 parts by mass |
| The monofunctional compound A2 | 10.0 parts by mass |
| The compound B1 | 3.0 parts by mass |
| The compound C1 | 8.0 parts by mass |
| The polymerization initiator S1 | 3.0 parts by mass |
| The leveling agent P2 | 0.3 parts by mass |
| The leveling agent P3 | 0.3 parts by mass |
| Cyclopentanone | 325.2 parts by mass |
| Methyl ethyl ketone | 37.4 parts by mass |
| Methanol | 11.2 parts by mass |

Rod-like liquid crystal compound R7

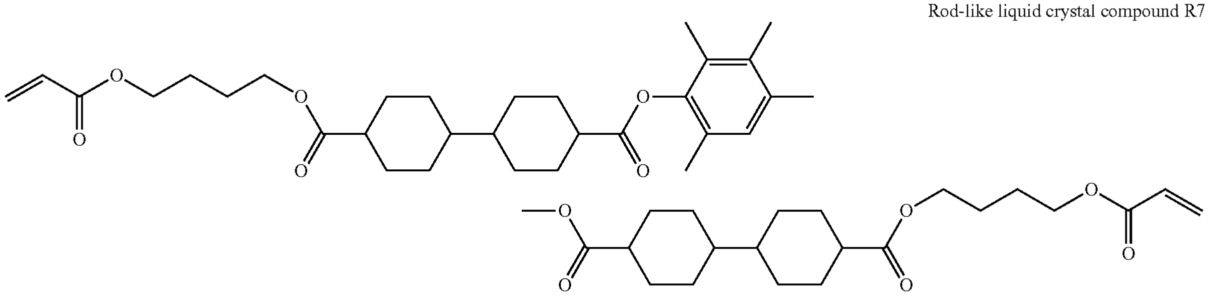

Example 12

An optically anisotropic layer C12 of Example 12 was manufactured by the same method as in Example 1, except that the polymerizable liquid crystal composition C12 having the following composition was used instead of the polymerizable liquid crystal composition C1, and each evaluation was performed.

Example 13

An optically anisotropic layer A2 and an optically anisotropic layer C13 of Example 13 were manufactured by the same method as in Example 1, except that the polymerizable liquid crystal composition A2 having the following composition was used instead of the polymerizable liquid crystal composition A1, and the polymerizable liquid crystal composition C13 having the following composition was used instead of the polymerizable liquid crystal composition C1, and each evaluation was performed.

In a case where the manufactured optically anisotropic layer A2 was peeled from the protective film 1 and the photo-optical alignment film 1, and a phase difference of the optically anisotropic layer A2 was measured, it was confirmed that an in-plane retardation ReA(550) was 140 nm, ReA(450)/ReA(550) was 0.86, ReA(650)/ReA(550) was 1.02, and the optically anisotropic layer A2 was a positive A-plate.

In addition, the protective film 1 and the photo-alignment film 1 were peeled from the Manufactured phase difference film, the phase difference of the laminate (the optically anisotropic layer C13/the optically anisotropic layer A2) was measured, the previously measured phase difference of the optically anisotropic layer A2 was subtracted therefrom to calculate a phase difference of the optically anisotropic layer C13, and thus, it was confirmed that the retardation RthC (550) in the thickness direction was −90 nm, RthC(450)/RthC(550) was 0.88, RthC(650)/RthC (550) was 1.02, and the optically anisotropic layer C13 was a positive C-plate.

Polymerizable Liquid Crystal Composition A2

| | |
|---|---|
| The rod-like liquid crystal compound R1 | 30.4 parts by mass |
| The rod-like liquid crystal compound R2 | 20.0 parts by mass |
| The rod-like liquid crystal compound R3 | 17.3 parts by mass |
| The rod-like liquid crystal compound R4 | 17.3 parts by mass |
| The following rod-like liquid crystal compound R8 | 15.0 parts by mass |
| The monofunctional compound A2 | 15.0 parts by mass |
| The following compound C2 | 3.0 parts by mass |
| The polymerization initiator S1 | 0.5 parts by mass |
| The following leveling agent P4 | 0.2 parts by mass |
| Cyclopentanone | 202.5 parts by mass |
| Methyl ethyl ketone | 60.5 parts by mass |

Rod-Like liquid crystal compound R8

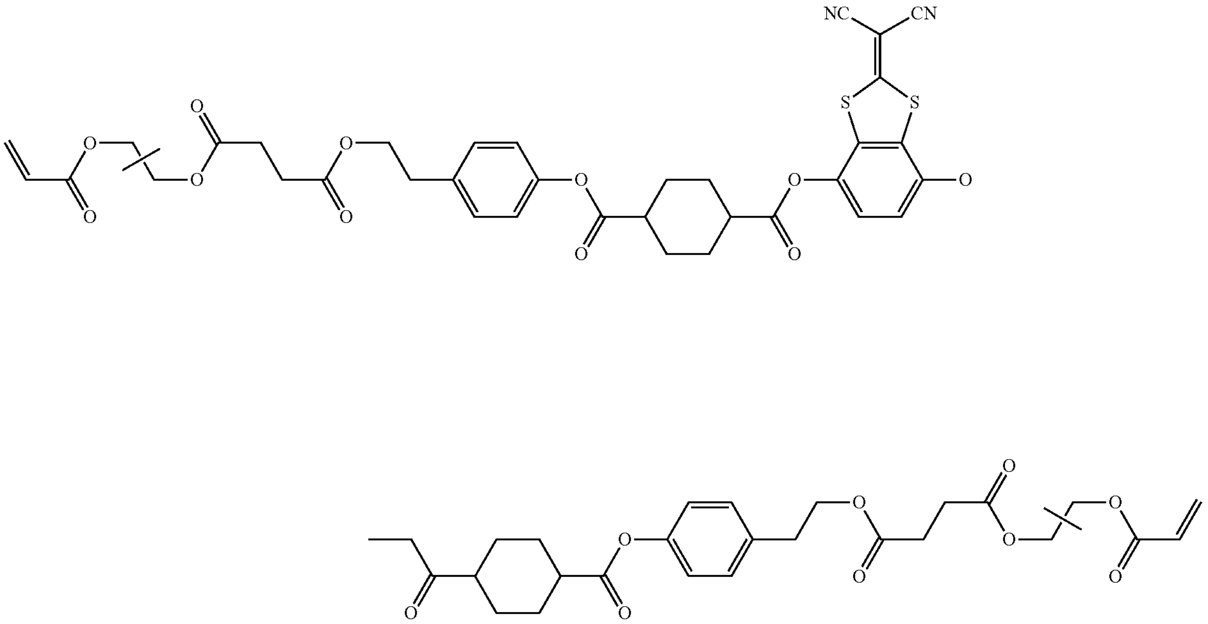

Compound C2

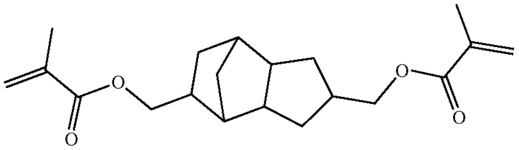

Leveling agent P4 (in the following formula: a, b, and c are a=34.5, b=61.0, and c=4.5, and represent contents (% by mass) of the respective repeating units with respect to all repeating units in the leveling agent P2)

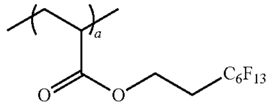

-continued

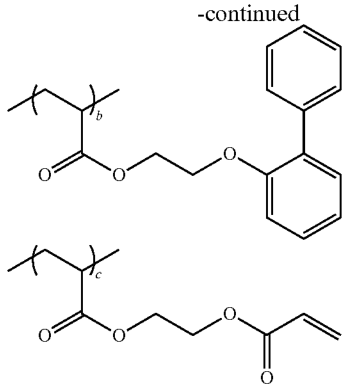

Polymerizable Liquid Crystal Composition C13

| | |
|---|---|
| The rod-like liquid crystal compound R1 | 21.0 parts by mass |
| The rod-like liquid crystal compound R2 | 21.0 parts by mass |
| The rod-like liquid crystal compound R3 | 19.0 parts by mass |
| The rod-like liquid crystal compound R4 | 19.0 parts by mass |
| The rod-like liquid crystal compound R8 | 20.0 parts by mass |
| The monofunctional compound A2 | 15.0 parts by mass |
| The compound B1 | 3.0 parts by mass |
| The following compound C3 | 8.0 parts by mass |
| The polymerization initiator S1 | 3.0 parts by mass |
| The leveling agent P2 | 0.3 parts by mass |
| The leveling agent P3 | 0.3 parts by mass |
| Cyclopentanone | 232.8 parts by mass |
| Methyl ethyl ketone | 60.5 parts by mass |
| Methanol | 9.1 parts by mass |

Compound C3 (mixture of the following compounds)

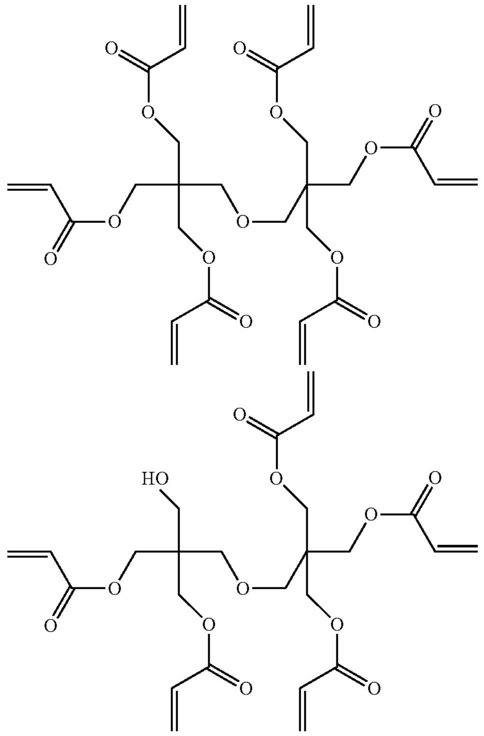

Example 14

An optically anisotropic layer A3 and an optically anisotropic layer C14 of Example 14 were manufactured by the same method as in Example 13, except that the polymerizable liquid crystal composition A3 using the following leveling agent P5 was used instead of the leveling agent P4 included in the polymerizable liquid crystal composition A2, and the polymerizable liquid crystal composition C14 having the following composition was used instead of the polymerizable liquid crystal composition C13, and each evaluation was performed.

In a case where the produced optically anisotropic layer A3 was peeled off from the protective film 1 and the photo-optical alignment film 1 and the phase difference of the optically anisotropic layer A3 was measured, the in-plane retardation ReA(550) was 140 nm, ReA(450)/ReA(550) was 0.86, ReA(650)/ReA(550) was 1.02, and it was confirmed that the optically anisotropic layer A3 was a positive A-plate.

In addition, the protective film 1 and the photo-alignment film 1 were peeled from the manufactured phase difference film, the phase difference of the laminate (the optically anisotropic layer C14/the optically anisotropic layer A3) was measured, the previously measured phase difference of the optically anisotropic layer A3 was subtracted therefrom to calculate a phase difference of the optically anisotropic layer C14, and thus, it was confirmed that the retardation RthC(550) in the thickness direction was −90 nm, RthC(450)/RthC(550) was 0.88, RthC(650)/RthC (550) was 1.02, and the optically anisotropic layer C14 was a positive C-plate.

Leveling agent P5 (in the following formula: a, b, and c are a=44.8, b=50.3, and c=4.9, and represent contents (% by mass) of the respective repeating units with respect to all repeating units in the leveling agent P5)

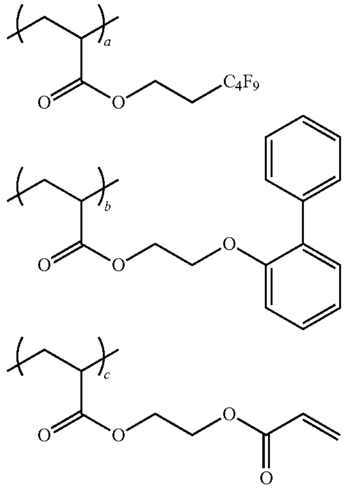

Polymerizable Liquid Crystal Composition C14

| | |
|---|---|
| The rod-like liquid crystal compound R1 | 21.0 parts by mass |
| The rod-like liquid crystal compound R2 | 21.0 parts by mass |
| The rod-like liquid crystal compound R3 | 19.0 parts by mass |
| The rod-like liquid crystal compound R4 | 19.0 parts by mass |
| The rod-like liquid crystal compound R8 | 20.0 parts by mass |

-continued

| | |
|---|---|
| The monofunctional compound A2 | 15.0 parts by mass |
| The compound B1 | 3.0 parts by mass |
| The following compound C3 | 8.0 parts by mass |
| The polymerization initiator S1 | 3.0 parts by mass |
| The leveling agent P2 | 0.3 parts by mass |
| The following leveling agent P6 | 0.3 parts by mass |
| Cyclopentanone | 232.8 parts by mass |
| Methyl ethyl ketone | 60.5 parts by mass |
| Methanol | 4.6 parts by mass |
| Isopropyl alcohol | 4.6 parts by mass |

Leveling agent P6 (in the following formula: a, b, c, and d are a=7.0 , b=10.0, and c=72.0, and d=2.0, and represent contents (% by mass) of the respective repeating units with respect to all repeating units in the leveling agent P6)

Leveling agent P6

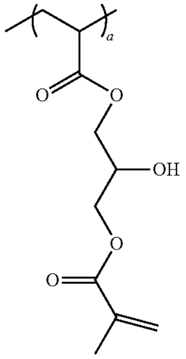

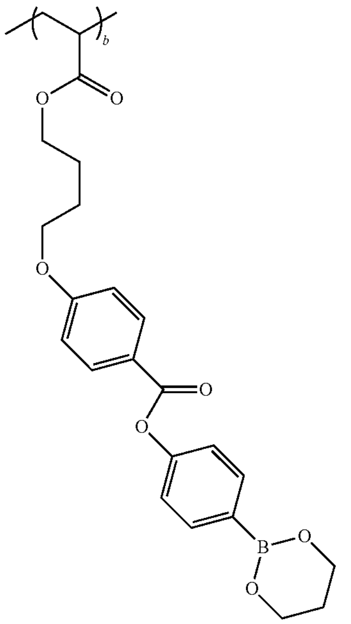

-continued

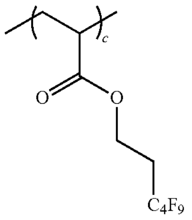

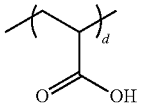

Comparative Example 1

An optically anisotropic layer C15 of Comparative Example 1 was manufactured by the same method as in Example 1, except that the monofunctional compound A1 was removed from the polymerizable liquid crystal composition C1, thereby preparing a polymerizable liquid crystal composition C15, and each evaluation was performed.

Comparative Example 2

An optically anisotropic layer C16 of Comparative Example 2 was manufactured by the same method as in Example 1, except that the monofunctional compound A2 was removed from the polymerizable liquid crystal composition C9, thereby preparing a polymerizable liquid crystal composition C16, and each evaluation was performed.

Comparative Example 3

An optically anisotropic layer C17 of Comparative Example 3 was manufactured by the same method as in Example 1, except that the monofunctional compound A6 was removed from the polymerizable liquid crystal composition C10, thereby preparing a polymerizable liquid crystal composition C17, and each evaluation was performed.

Comparative Example 4

An optically anisotropic layer C18 of Comparative Example 4 was manufactured by the same method as in Example 1, except that the following monofunctional compound A7 was used instead of the monofunctional compound A1 included in the polymerizable liquid crystal composition C1, thereby preparing a polymerizable liquid crystal composition C18, and each evaluation was performed.

Monofunctional compound A7

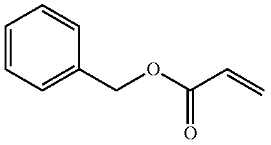

Comparative Example 5

An optically anisotropic layer C19 of Comparative Example 5 was manufactured by the same method as in Example 1, except that the following polymerizable compound A8 was used instead of the monofunctional compound A1 included in the polymerizable liquid crystal composition C1, thereby preparing a polymerizable liquid crystal composition C19, and each evaluation was performed.

Polymerizable compound A8

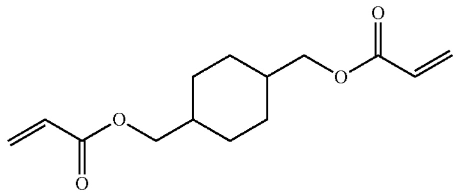

Comparative Example 6

An optically anisotropic layer C20 of Comparative Example 6 was manufactured by the same method as in Example 1, except that the following monofunctional compound A9 was used instead of the monofunctional compound A1 included in the polymerizable liquid crystal composition C1, thereby preparing a polymerizable liquid crystal composition C20, and each evaluation was performed.

Monofunctional compound A9

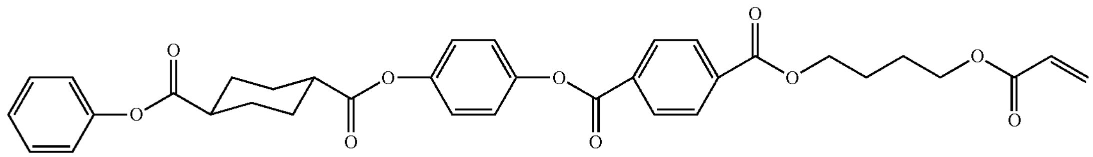

Comparative Example 7

An optically anisotropic layer C21 of Comparative Example 7 was manufactured by the same method as in Example 1, except that the following monofunctional compound A10 was used instead of the monofunctional compound A1 included in the polymerizable liquid crystal composition C1, thereby preparing a polymerizable liquid crystal composition C21, and each evaluation was performed.

Monofunctional compound A10

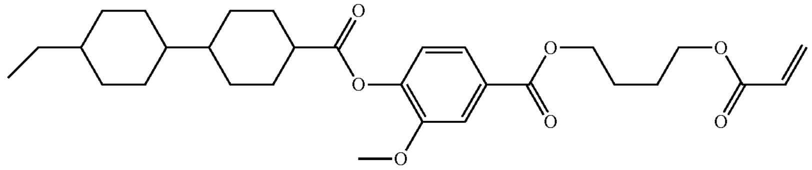

Comparative Example 8

An optically anisotropic layer C22 of Comparative Example 8 was manufactured by the same method as in Example 1, except that the monofunctional compound A10 was used instead of the monofunctional compound A2 included in the polymerizable liquid crystal composition C6, thereby preparing a polymerizable liquid crystal composition C22, and each evaluation was performed.

The compositions of the polymerizable liquid crystal compositions used fur forming the optically anisotropic layers C1 to C22 in Examples 1 to 14 and Comparative Examples 1 to 8, and the evaluation results of the defects of the formed optically anisotropic layers, the haze measurement, and oblique light leakage are each shown in Table 4 below.

In Table 4 below, the "Ratio a2/a1" column shows a ratio of the number a2 of atoms of the monofunctional compounds A1 to 10 to the number a1 of atoms of the rod-like liquid crystal compounds R1 to R7 in each of Examples and Comparative Examples.

Furthermore, it was confirmed that in a case where the phase difference of the optically anisotropic layers C2 to C22 formed in Examples 2 to 14 and Comparative Examples 1 to 8 were measured in the same manner as in Example 1, the thickness-direction retardation RthC(550) was 150 to −70 nm, RthC(450)/RthC(550) was 0.58 to 1.05, and all of the optically anisotropic layers were positive C-plates. In addition, in Example 9 and Comparative Example 2, a compound exhibiting a liquid crystal state of a nematic phase was used, and in the other cases, at least one compound exhibiting a liquid crystal state of a smectic phase was used.

TABLE 4

| | Composition of polymerizable liquid crystal composition | | | | | Evaluation | | |
|---|---|---|---|---|---|---|---|---|
| | Rod-like liquid crystal compound | | Monofunctional compound | | | | | |
| | Type | Number a1 of atoms | Type | Number a2 of atoms | Ratio a2/a1 | Recess defects | Haze | Oblique light leakage |
| Example 1 | R1 | 44 | A1 | 22 | 0.50 | A | A | A |
| Example 2 | R1 | 44 | A2 | 22 | 0.50 | A | A | A |
| Example 3 | R1 | 44 | A3 | 20 | 0.45 | A | A | A |
| Example 4 | R1 | 44 | A4 | 24 | 0.55 | A | A | A |
| Example 5 | R1 | 44 | A5 | 30 | 0.68 | A | A | B |
| Example 6 | R5 | 56 | A2 | 22 | 0.39 | A | A | A |
| Example 7 | R5 | 56 | A6 | 22 | 0.39 | A | A | A |
| Example 8 | R3 | 44 | A2 | 22 | 0.50 | A | A | A |
| Example 9 | R2 | 44 | A2 | 22 | 0.50 | A | A | B |
| Example 10 | R6 | 50 | A6 | 22 | 0.44 | A | A | A |
| Example 11 | R1 | 44 | A2 | 22 | 0.50 | A | A | A |
| | R2 | | | | 0.50 | | | |
| | R3 | | | | 0.50 | | | |
| | R4 | | | | 0.50 | | | |
| Example 12 | R1 | 44 | A2 | 22 | 0.50 | A | A | A |
| | R2 | | | | 0.50 | | | |
| | R3 | | | | 0.50 | | | |
| | R4 | | | | 0.50 | | | |
| | R7 | | | | 0.50 | | | |
| Example 13 | R1 | 44 | A2 | 22 | 0.50 | A | A | A |
| | R2 | 44 | | | 0.50 | | | |
| | R3 | 44 | | | 0.50 | | | |
| | R4 | 44 | | | 0.50 | | | |
| | R8 | 56 | | | 0.39 | | | |
| Example 14 | R1 | 44 | A2 | 22 | 0.50 | A | A | A |
| | R2 | 44 | | | 0.50 | | | |
| | R3 | 44 | | | 0.50 | | | |
| | R4 | 44 | | | 0.50 | | | |
| | R8 | 56 | | | 0.39 | | | |
| Comparative Example 1 | R1 | 44 | — | — | — | C | B | C |
| Comparative Example 2 | R2 | 44 | — | — | — | B | A | C |
| Comparative Example 3 | R6 | 50 | — | — | — | C | B | C |
| Comparative Example 4 | R1 | 44 | A7 | 9 | 0.20 | C | B | C |
| Comparative Example 5 | R1 | 44 | A8 | 14 | 0.32 | C | B | C |
| Comparative Example 6 | R1 | 44 | A9 | 32 | 0.73 | C | B | C |
| Comparative Example 7 | R1 | 44 | A10 | 26 | 0.59 | B | A | C |
| Comparative Example 8 | R5 | 56 | A10 | 26 | 0.46 | B | A | C |

From the results shown in Table 4 above, it was found that in a case where the optically anisotropic layer was formed using a polymerizable liquid crystal composition including no nonfunctional compound, recess defects were generated in the optically anisotropic layer and oblique light leakage occurred in the image display device (Comparative Examples 1 to 3).

In addition, it was found that in a case where a ratio of the number a2 of atoms of the monofunctional compound to the number a1 of atoms of the rod-like liquid crystal compound does not satisfy a relationship (lower limit) of Expression (1), recess defects were generated in the optically anisotropic layer and oblique light leakage occurred in the image display device even in a case where the polymerizable liquid crystal composition includes a monofunctional compound (Comparative Example 4).

Moreover, it was found that in a case where the polymerizable liquid crystal composition does not include a monofunctional compound and includes a compound having functional groups at both terminals in addition to the rod-like liquid crystal compound, recess defects were generated in the optically anisotropic layer and oblique light leakage occurred in the image display device (Comparative Example 5).

In addition, it was found that in a case where a ratio of the number a2 of atoms of the monofunctional compound to the number a1 of atoms of the rod-like liquid crystal compound does not satisfy a relationship (upper limit) of Expression (1), recess defects were generated in the optically anisotropic layer and oblique light leakage occurred in the image display device even in a case where the polymerizable liquid crystal composition includes a monofunctional compound (Comparative Example 6).

In addition, it was found that in a case where the terminal opposite to the polymerizable group is composed of a terminal other than a ring structure, recess defects were generated in the optically anisotropic layer and oblique light leakage occurred in the image display device even in a case where the polymerizable liquid crystal composition includes a monofunctional compound (Comparative Examples 7 and 8).

In contrast, it was found that in a case where the polymerizable liquid crystal composition includes a predetermined rod-like liquid crystal compound and a predetermined monofunctional compound, and the rod-like liquid crystal compound and the monofunctional compound included in the polymerizable liquid crystal composition satisfy Expression (1), recess defects in the optically anisotropic layer can be suppressed, the haze of the phase difference film is excellent, and the occurrence of oblique light leakage in the image display device can be suppressed (Examples 1 to 14).

In particular, from the comparison of Examples 1 to 5, it was found that in a case where the number a1 of atoms of the rod-like liquid crystal compound and the number a2 of atoms of the monofunctional compound satisfy the relationship of Expression (1a), the occurrence of oblique light leakage in the image display device can be further suppressed.

EXPLANATION OF REFERENCES

10: optical film
12: optically anisotropic layer
14: alignment film
16: support

What is claimed is:

1. An optically anisotropic layer obtained by curing a polymerizable liquid crystal composition including a rod-shaped liquid crystal compound and a monofunctional compound, in an alignment state of the rod-shaped liquid crystal compound, wherein the optically anisotropic layer has one surface and another surface;

wherein the rod-shaped liquid crystal compound is a compound represented by Formula (I), $$P^1\text{-}Sp^1\text{-}(X^1\text{-}Ar^1)_{n1}\text{-}(X^2\text{-}Cy^1)_{m1}\text{-}(X^3\text{-}Ar^3)_{k1}\text{-}X^4\text{-}(Cy^2\text{-}X^5)_{m2}\text{-}(Ar^2\text{-}X^6)_{n2}\text{-}Sp^2\text{-}P^2 \quad (I)$$

wherein in Formula (I), $P^1$ and $P^2$ each independently represent an acryloyloxy group or a methacryloyloxy group, wherein $P^1$ includes a first terminal atom and $P^2$ includes a second terminal atom of the rod-shaped liquid crystal compound represented by Formula (I), wherein the first terminal atom of the rod-shaped liquid crystal compound is a starting atom and the second terminal atom of the rod-shaped liquid crystal compound represented by Formula (I) is an ending atom utilized to calculate a maximum number of atoms linked together at a shortest distance to form the rod- shaped liquid crystal compound represented by Formula (I), wherein the maximum number of atoms linked together at a shortest distance to form the rod-shaped liquid crystal compound represented by Formula (I) is counted such that the starting atom and the ending atom are also counted;

$Sp^1$ and $Sp^2$ each independently represent a single bond, a linear alkylene group having 1 to 14 carbon atoms, a branched alkylene group having 3 to 14 carbon atoms, or a divalent linking group in which one or more of —$CH_2$—'s constituting the linear or branched alkylene group are substituted with —O—, —S—, —NH—, —N(Q)—, or —CO—, where Q represents a substituent, n1, m1, m2, and n2 each independently represent an integer of 0 to 2, provided that at least one of m1 or n1 represents 1 or 2, and at least one of m2 or n2 represents 1 or 2, k1 represents 1 or 2, $X^1$, $X^2$, $X^3$, $X^4$, $X^5$, and $X^6$ each independently represent a single bond; or —CO—, —O—, —S—, —C(═S)—, —$CR^1R^2$—, —$CR^3$═$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n1 is 2, a plurality of $X^1$'s may be the same as or different from each other; in a case where m1 is 2, a plurality of $X^2$'s may be the same as or different from each other; in a case where k1 is 2, a plurality of $X^3$'s may be the same as or different from each other; in a case where m2 is 2, a plurality of $X^5$'s may be the same as or different from each other; and in a case where n2 is 2, a plurality of $X^6$'s may be the same as or different from each other, $Ar^1$ and $Ar^2$ each independently represent an aromatic ring which may have a substituent, provided that in a case where n1 is 2, a plurality of $Ar^1$'s may be the same as or different from each other; and in a case where n2 is 2, a plurality of $Ar^2$'s may be the same as or different from each other, $Cy^1$ and $Cy^2$ each independently represent an alicyclic ring which may have a substituent, provided that in a case where m1 is 2, a plurality of $Cy^1$'s may be the same as or different from each other; and in a case where m2 is 2, a plurality of $Cy^2$'s may be the same as or different from each other, $Ar^3$ represents any of aromatic rings selected from the group consisting of the groups represented by Formulae (Ar-1) to (Ar-7), provided that in a case where k1 is 2, a plurality of $Ar^3$'s may be the same as or different from each other, and (Ar-1)

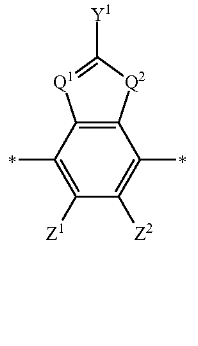

(Ar-2)

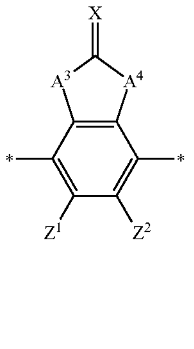

-continued (Ar-3)

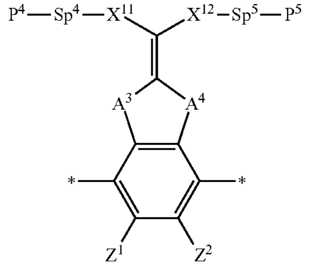

(Ar-4)

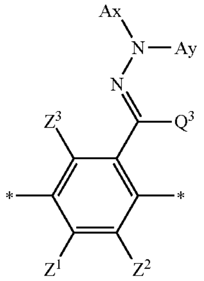

(Ar-5)

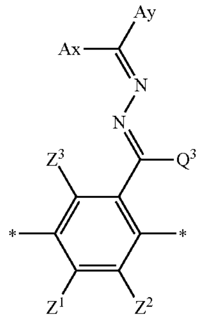

(Ar-6)

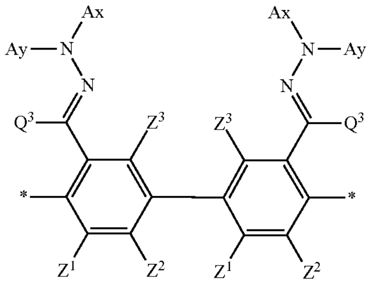

(Ar-7)

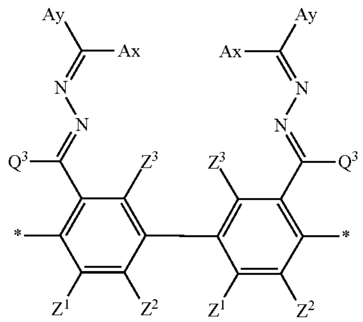

wherein in Formulae (Ar-1) to (Ar-7), in a case where k1 represents 1, one of two * represents a bonding position to $X^3$, and the other represents a bonding position to $X^4$; in a case where k1 represents 2 and $Ar^3$ exists between two $X^3$s, two * represent a bonding position to $X^3$, respectively; in a case where k1 represents 2 and $Ar^3$ exists between $X^3$ and $X^4$, one of two * represents a bonding position to $X^3$, and the other represents a bonding position to $X^4$, $Q^1$ represents N or CH, $Q^2$ represents —S—, —O—, or —N($R^6$)—, where $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$—'s constituting the alicyclic hydrocarbon group may be substituted with —O—, —S—, or —NH—, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 3 to 20 carbon atoms, a halogen atom, a cyano group, a nitro group, —$OR^7$, —$NR^8R^9$, —$SR^{10}$, $COOR^{11}$, or —$COR^{12}$, $R^7$ to $R^{12}$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($R^{13}$)—, —S—, and —CO—, where $R^{13}$ represents a hydrogen atom or a substituent, X represents a non-metal atom of Groups XIV to XVI, to which a hydrogen atom or a substituent may be bonded, $X^{11}$ and $X^{12}$ each independently represent a single bond; or —CO—, —O—, —S—, —C(═S)—, —$CR^1R^2$—, —$CR^3$═$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms, $Sp^4$ and $Sp^5$ each independently represent a single bond, a linear alkylene group having 1 to 14 carbon atoms, a branched alkylene group having 3 to 14 carbon atoms, or a divalent linking group in which one or more of -$CH_2$—'s constituting the linear or branched alkylene group are substituted with —O—, —S—, —NH—, —N(Q)—, or —CO—, where Q represents a substituent, $P^4$ and $P^5$ each independently represent a monovalent organic group, and at least one of $P^4$ or $P^5$ represents a polymerizable group, Ax represents at least one aromatic ring selected from the group consisting of an aromatic hydrocarbon ring and an aromatic heterocyclic ring, Ay represents a hydrogen atom, an alkyl group which may have a substituent, or at least one aromatic ring selected from the group consisting of an aromatic hydrocarbon ring and an aromatic heterocyclic ring, wherein the aromatic ring in each of Ax and Ay may have a substituent, and Ax and Ay may be bonded to each other to form a ring, and $Q^3$ represents a hydrogen atom or an alkyl group having 1 to 6 carbon atoms, which may have a substituent, wherein the monofunctional compound is a compound represented by Formula (II), $$P^3—Sp^3—(X^7—B^3)_{n3}—X^8—B^2 \quad (II)$$

wherein in Formula (II), $P^3$ represents an acryloyloxy group or a methacryloyloxy group, wherein $P^3$ includes a first terminal atom and $B^2$ includes a second terminal atom of the monofunctional compound represented by Formula (II), wherein the first terminal atom of the monofunctional compound represented by Formula (II) is a starting atom and the second terminal atom of the monofunctional compound represented by Formula (II) is an ending atom utilized to calculate a maximum number of atoms linked together at a shortest distance to form the monofunctional compound represented by Formula (II), wherein the maximum number of atoms linked together at a shortest distance to form the monofunctional compound represented by Formula (II) is counted such that the first terminal atom and the second terminal atom are also counted;

$Sp^3$ represents a single bond, a linear alkylene group having 1 to 14 carbon atoms, a branched alkylene group having 3 to 14 carbon atoms, or a divalent linking group in which one or more of $—CH_2$-'s constituting the linear or branched alkylene group are substituted with —O—, —S—, —NH—, —N(Q)—, or —CO—, where Q represents a substituent, n3 represents 1 or 2, $X^7$ and $X^8$ each independently represent a single bond; or —CO—, —O—, —S—, —C(=S)—, $—CR^1R^2—$, $—CR^3=CR^4—$, $—NR^5—$, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where n3 is 2, a plurality of $X^7$'s may be the same as or different from each other, $B^3$ represents an aromatic ring which may have a substituent or an alicyclic ring which may have a substituent, and at least one of $B^3$ represents a cyclohexane ring, provided that in a case where n3 is 2, a plurality of $B^3$'s may be the same as or different from each other, and $B^2$ represents a benzene ring which has no substituent, wherein the rod-shaped liquid crystal compound and the monofunctional compound satisfy a relationship of Expression (1), wherein the rod-shaped liquid crystal compound within the polymerizable liquid crystal composition is in a state of being vertically aligned with respect to the one surface of the optically anisotropic layer, $$0.2<a2/a1\leq 0.68 \quad \text{Expression (1)}$$

wherein in Expression (1), a1 is the maximum number of atoms linked together between the starting atom and the ending atom at the shortest distance to form the rod-shaped liquid crystal compound represented by Formula (I), counted such that the starting atom and the ending atom are also counted; and a2 is the maximum number of atoms linked together between the starting atom and the ending atom at the shortest distance to form the monofunctional compound represented by Formula (II), counted such that the starting atom and the ending atom are also counted.

2. The optically anisotropic layer according to claim 1, wherein the rod-shaped liquid crystal compound is a compound exhibiting a liquid crystal state of a smectic phase.

3. The optically anisotropic layer according to claim 1, wherein in Formula (I), all of n1, m1, k1, m2, and n2 are 1.

4. The optically anisotropic layer according to claim 1, wherein in Formula (I), both of n1 and n2 are 0, both of m1 and m2 are 2, and k1 is 1.

5. The optically anisotropic layer according to claim 1, wherein the rod-shaped liquid crystal compound has at least one 1,4-cyclohexylene group.

6. The optically anisotropic layer according to claim 1, wherein the monofunctional compound has at least one 1,4-cyclohexylene group or 1,4-phenylene group.

7. The optically anisotropic layer according to claim 1, wherein a content of the monofunctional compound is 1 to 100 parts by mass with respect to 100 parts by mass of the rod-shaped liquid crystal compound.

8. The optically anisotropic layer according to claim 1, wherein the optically anisotropic layer is a positive C-plate.

9. An optical film comprising the optically anisotropic layer according to claim 1.

10. A polarizing plate comprising:

the optical film according to claim 9; and a polarizer.

11. An image display device comprising the optical film according to claim 9.

12. The image display device according to claim 11, wherein the image display device is a liquid crystal display device.

13. The image display device according to claim 11, wherein the image display device is an organic EL display device.

14. The optically anisotropic layer according to claim 1, wherein in Formula (II), n3 represents 2.

* * * * *